US009245921B2

(12) United States Patent
Yamamoto et al.

(10) Patent No.: US 9,245,921 B2
(45) Date of Patent: Jan. 26, 2016

(54) SEMICONDUCTOR DEVICE INCLUDING IMAGE PICK UP DEVICE

(71) Applicant: RENESAS ELECTRONICS CORPORATION, Kawasaki-shi, Kanagawa (JP)

(72) Inventors: Yuki Yamamoto, Kanagawa (JP); Yukio Nishida, Kanagawa (JP); Tomohiro Yamashita, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/537,633

(22) Filed: Nov. 10, 2014

(65) Prior Publication Data

US 2015/0206920 A1 Jul. 23, 2015

(30) Foreign Application Priority Data

Jan. 21, 2014 (JP) ................. 2014-009003

(51) Int. Cl.
| | |
|---|---|
| *H01L 27/148* | (2006.01) |
| *H01L 27/146* | (2006.01) |
| *H01L 27/108* | (2006.01) |
| *H01L 29/423* | (2006.01) |
| *H01L 29/10* | (2006.01) |

(52) U.S. Cl.
CPC .... *H01L 27/14812* (2013.01); *H01L 27/14609* (2013.01); *H01L 27/14614* (2013.01); *H01L 27/14641* (2013.01); *H01L 27/14887* (2013.01); *H01L 27/10876* (2013.01); *H01L 27/14831* (2013.01); *H01L 29/1091* (2013.01); *H01L 29/42396* (2013.01)

(58) Field of Classification Search
CPC ................. H01L 27/14692; H01L 27/14812; H01L 27/14609; H01L 27/14831; H01L 27/10876; H01L 29/42396; H01L 29/1091; H01L 27/14643; H01L 27/148
USPC ........... 257/229.222, 223, 225, 226, E31.026, 257/53; 438/48, 57
See application file for complete search history.

(56) References Cited

U.S. PATENT DOCUMENTS

| | | | |
|---|---|---|---|
| 6,586,807 B2 | 7/2003 | Nishida et al. | |
| 2006/0007338 A1* | 1/2006 | Wakano et al. | ............... 348/308 |

FOREIGN PATENT DOCUMENTS

JP          2001-217325 A          8/2001

* cited by examiner

*Primary Examiner* — Thinh T Nguyen
(74) *Attorney, Agent, or Firm* — McDermott Will & Emery LLP

(57) ABSTRACT

The performance of a semiconductor device is improved by preventing 1/f noise from being generated in a peripheral transistor, in the case where the occupation area of photodiodes, which are included in each of a plurality of pixels that form an image pickup device, is expanded. In the semiconductor device, the gate electrode of an amplification transistor is formed by both a gate electrode part over an active region and a large width part that covers the boundary between the active region and an element isolation region and the active region near the boundary and that has a gate length larger than that of the gate electrode part.

7 Claims, 12 Drawing Sheets

SEMICONDUCTOR DEVICE INCLUDING IMAGE PICK UP DEVICE

CROSS-REFERENCE TO RELATED APPLICATIONS

The disclosure of Japanese Patent Application No. 2014-009003 filed on Jan. 21, 2014 including the specification, drawings and abstract is incorporated herein by reference in its entirety.

BACKGROUND

The present invention relates to a semiconductor device, and in particular, to a technique that is effective when applied to a semiconductor device including an image pick up device.

An image pick up device (picture element) to be used in a digital camera, etc., has a configuration in which, for example, a plurality of pixels, each including a photodiode that generates an electric charge when detecting light, are arrayed in a matrix pattern. As the configuration of a single pixel, a configuration is known, in which the aforementioned photodiode, a forwarding transistor that outputs the electric charge to a peripheral element, and the peripheral element that performs amplification of a signal, etc., are included. The peripheral element refers to a peripheral transistor such as, for example, an amplification transistor, a resetting transistor, a selection transistor, or the like, these peripheral transistors being used to select a signal sent from the forwarding transistor and to amplify and output the signal.

In Patent Document 1 (Japanese Unexamined Patent Application Publication No. 2001-217325), it is described that, in order to reduce a variation in the threshold voltage of a MISFET, the gate length of an end portion in the gate width direction of a gate electrode of the MISFET is made large, so that the whole one side of an active region along the gate length direction is covered by the end portion of the gate electrode.

RELATED ART DOCUMENT

Patent Document

[Patent Document 1] Japanese Unexamined Patent Application Publication No. 2001-217325

SUMMARY

As one type of the noise that are generated in a picture when the picture is obtained by receiving light with the use of an image pickup device, there is readout noise that is mixed in a signal when the signal is readout from a light receiving part. The readout noise is one whose main component is 1/f noise that is generated: because a current flows in an active region that is located in a channel region of a peripheral transistor that forms a pixel and located near an element isolation region; because the threshold voltage of a peripheral transistor is high; or the like. When the gate width of a gate electrode is small, the 1/f noise is generated mainly because a current flows near the boundary between an active region and an element isolation region in a channel region under the gate electrode of an amplification transistor.

If the area of a photodiode, which forms each pixel of an image pickup device, is intended to be increased, it becomes difficult to arrange an amplification transistor, the gate electrode of which has a large gate width, between adjacent photodiodes. In the 1/f noise generated in a transistor having a small gate width, the ratio of the noise, which is generated because a current flows near the boundary between an active region and an element isolation region, is increased. Accordingly, in order to improve the performance of an image pickup device, it is particularly important to reduce the noise generated because a current flows near the boundary between an active region and an element isolation region.

Other purposes and new characteristics will become clear from the description of the present specification and accompanying drawings.

Of the preferred embodiments disclosed in the present application, outlines of the typical ones will be briefly described as follows.

In a semiconductor device of one embodiment, a gate electrode of an amplification transistor is formed by: a gate electrode part over an active region; and a large width part that covers the boundary between the active region and an element isolation region and an active region near the boundary and that has a gate length larger than that of the gate electrode part.

According to one embodiment disclosed in the present application, the performance of a semiconductor device can be improved. In particular, occurrence of noise in a pixel can be prevented.

DETAILED DESCRIPTION

Hereinafter, preferred embodiments will be described with reference to accompanying drawings, in which the structure of the gate electrode of a MOS (Metal Oxide Semiconductor) type field effect transistor is particularly characteristic and a reduction in occurrence of noise in, for example, an image pickup device can be achieved.

First Embodiment

Figure 1:
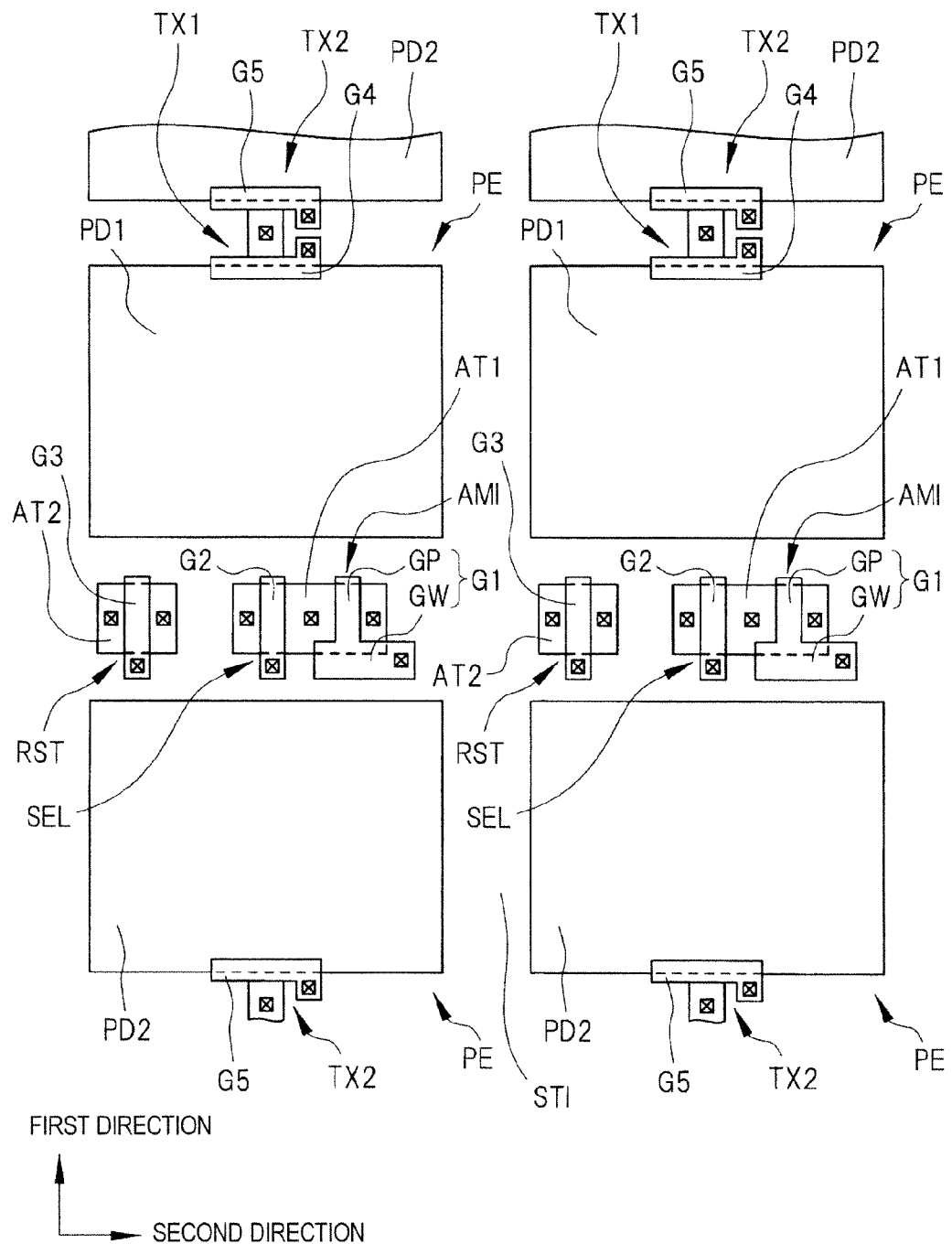
FIG. 1 is a planar layout illustrating a semiconductor device according to First Embodiment of the present invention.
Figure 2:
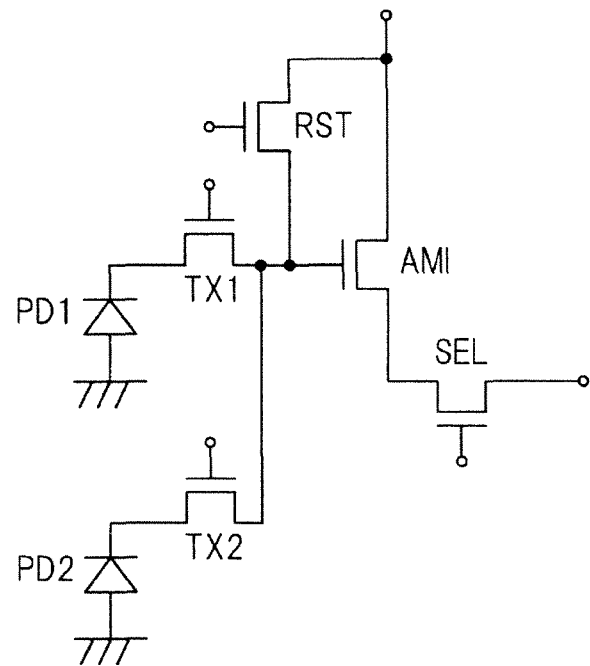
FIG. 2 is an equivalent circuit diagram illustrating the semiconductor device according to First Embodiment of the invention.
Figure 3:
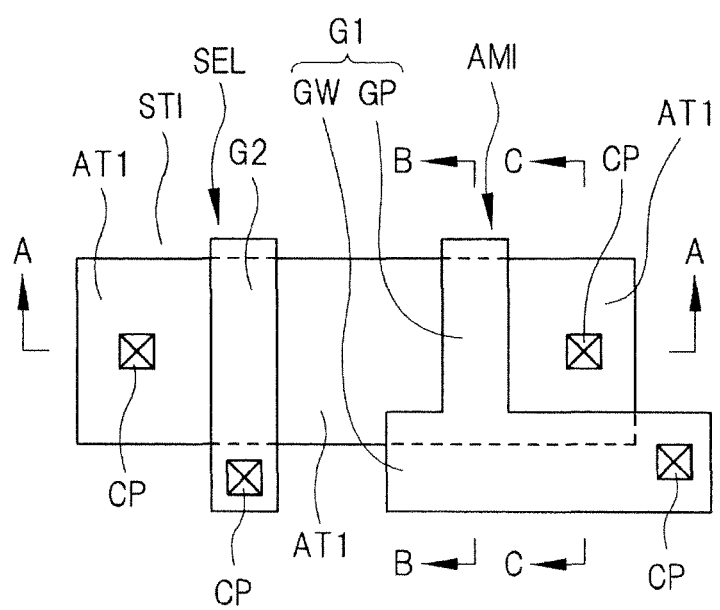
FIG. 3 is a planar layout illustrating the semiconductor device according to First Embodiment of the invention.
Figure 4:
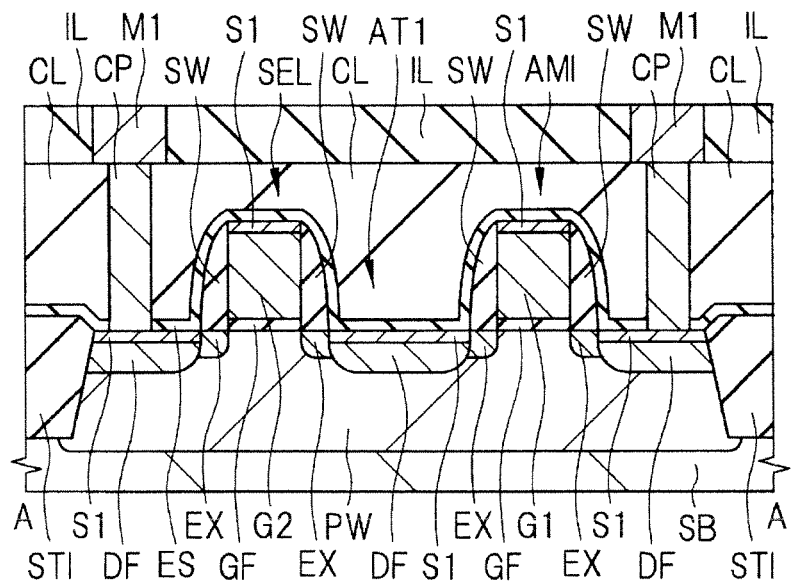
FIG. 4 is a sectional view, taken along A-A Line in FIG. 3.
Figure 5:
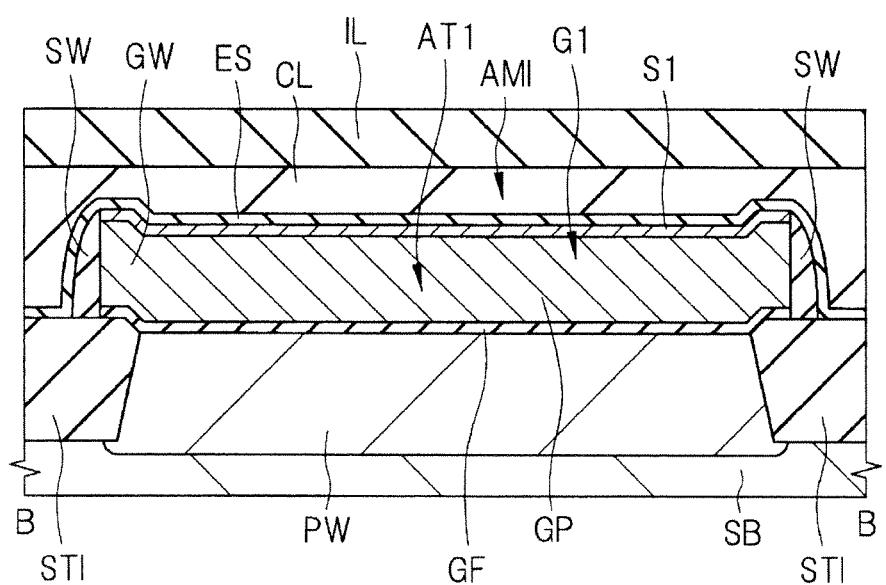
FIG. 5 is a sectional view, taken along B-B Line in FIG. 3.
Figure 6:
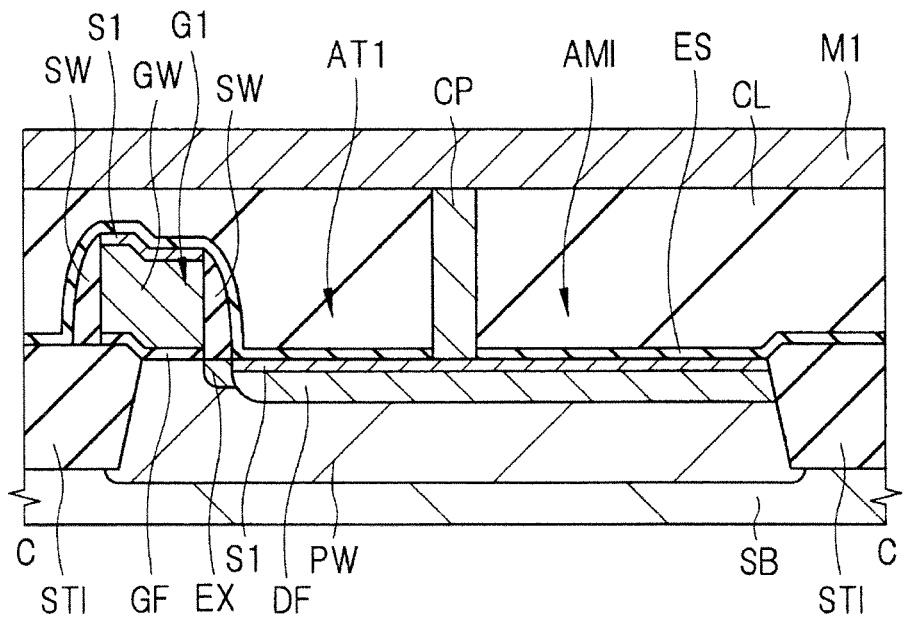
FIG. 6 is a sectional view, taken along C-C Line in FIG. 3.

Hereinafter, a semiconductor device of the present embodiment will be described with reference to FIGS. 1 to 6. FIG. 1 is a planar layout illustrating pixels in the semiconductor device of the embodiment, FIG. 2 is an equivalent circuit diagram of the pixels in the semiconductor device of the embodiment, and FIG. 3 is a planar layout illustrating enlarged part of a peripheral transistor of the pixel in the semiconductor device of the embodiment. FIG. 4 is a sectional view, taken along A-A Line in FIG. 3, FIG. 5 is a sectional view, taken along B-B Line in FIG. 3, and FIG. 6 is a sectional view, taken along C-C Line in FIG. 3;

An image pickup device of the present embodiment is formed in one semiconductor chip, and is formed by a plurality of light receiving parts that are arrayed over the upper surface of the semiconductor chip in a matrix pattern, namely, by a plurality of pixels. Each of the pixels that form the image pickup device is electrically coupled to a row selection circuit and a line selection circuit. A signal read out from one pixel is externally outputted from the row selection circuit that is a readout circuit. The row selection circuit and the line selection circuit are formed over the same semiconductor substrate as the image pickup device.

FIG. 1 illustrates a planar layout in which, of the pixels arrayed in the line direction and the row direction, four pixels PE are mainly enlarged. In FIG. 1, illustration of a wiring layer over the pixels is omitted. As illustrated in FIG. 1, each pixel PE includes a photodiode PD1 or PD2 that is a light receiving element. Each of the photodiodes PD1 and PD2 is a semiconductor element formed in a main surface of a semiconductor substrate, and has a rectangular shape in plan view. The photodiode PD1 or PD2 is a photoelectric conversion element that generates a signal electric charge in accordance with a light amount of incident light.

As illustrated in FIG. 1, the photodiodes PD1 and PD2 are alternately arranged in First Direction extending along the main surface of the semiconductor substrate, and a plurality of such rows are arranged side by side in Second Direction that is perpendicular to First Direction and extends along the main surface of the semiconductor substrate.

Three types of transistors that are peripheral transistors of the pixel PE, namely, an amplification transistor AMI, a resetting transistor RST, and a selection transistor SEL are formed in a periphery of the photodiode PD1 or PD2. Other than the aforementioned peripheral transistors, a forwarding transistor TX1, part of which is shared with the photodiode PD1, and a forwarding transistor TX2, part of which is shared with the photodiode PD2, are formed. All of the forwarding transistors TX1 and TX2, the amplification transistor AMI, the resetting transistor RST, and the selection transistor SEL are n-channel MOS type field effect transistors, namely, MOSFETs (Metal Oxide Semiconductor Field Effect Transistors).

A pixel PE is formed by the photodiode PD1, the forwarding transistor TX1, the amplification AMI, the resetting transistor RST, and the selection transistor SEL. Another pixel PE is formed by the photodiode PD2, the forwarding transistor TX2, the amplification transistor AMI, the resetting transistor RST, and the selection transistor SEL.

A plurality of gate electrodes G1 to G5 are formed over the semiconductor substrate over which the pixel PE is formed. The gate electrode G4 that forms the forwarding transistor TX1 extends along one side of the rectangular photodiode PD1, and is formed to bestride, in plan view, the boundary between an active region protruding from the photodiode PD1 and the photodiode PD1. The forwarding transistor TX1 is a MOSFET that has part of the photodiode PD1 and a protruding portion of the active region as a source/drain region.

Similarly, the gate electrode G5 that forms the forwarding transistor TX2 extends along one side of the rectangular photodiode PD2, and is formed to bestride, in plan view, the boundary between an active region protruding from the photodiode PD2 and the photodiode PD2. Herein, the adjacent photodiodes PD1 and PD2 shares the aforementioned active region that protrudes from the photodiode PD1, namely, the drain region of the forwarding transistor TX1, and the aforementioned active region that protrudes from the photodiode PD2, namely, the drain region of the forwarding transistor TX2.

The resetting transistor RST, the amplification transistor AMI, and the selection transistor SEL are arranged side by side in Second Direction. Each of the gate electrodes G1 and G2 that form the amplification transistor AMI and the selection transistor SEL is arranged over an active region AT1 so as to bestride one active region AT1. That is, each of the gate electrodes G1 and G2 crosses over the active region AT1 from one end portion of the active region AT1 to the other end portion thereof. The gate electrode G3 that forms the resetting transistor RST is arranged over an active region AT2 so as to bestride one active region AT2. The active regions AT1 and AT2 are isolated from each other by an element isolation region STI.

The resetting transistor RST, the amplification transistor AMI, and the selection transistor SEL are arranged in a region sandwiched by the photodiodes PD1 and PD2 adjacent to each other in First Direction extending along the main surface of the semiconductor substrate, and each of the active regions AT1 and AT2 extends in Second Direction perpendicular to First Direction. Each of the gate electrodes G1 to G3 extends in First Direction perpendicular to the direction in which the active regions AT1 and AT2 extend. That is, the amplification transistor AMI and the selection transistor SEL are arranged to be sandwiched by the two photodiodes PD1 and PD2 in the gate width direction of the gate electrodes C1 and G2 that form the above transistors AMI and SEL, respectively.

The gate electrode G2 is formed to cover, in plan view, the upper surface of the active region AT1 from one end portion of the active region AT1 to the other end portion thereof in First Direction. Similarly, the gate electrode G1, having a gate pattern including a gate electrode part GP and a large width part GW, is formed to cover the upper surface of the active region AT1 from one end portion of the active region AT1 to the other end portion thereof in First Direction. The gate electrodes G1 and G2 are formed to protrude, in plan view, toward the element isolation region STI from the boundary between the active region AT1 and the element isolation region STI. That is, the gate electrode G1 is formed to bestride the aforementioned boundary, not being terminated, in First Direction, immediately above the active region AT1. In other words, the upper portions of some of the aforementioned boundary are covered by the gate electrode part GP and the large width part GW.

The resetting transistor RST has a pair of source/drain regions formed in the active region AT2. Each of the amplification transistor AMI and the selection transistor SEL has a pair of source/drain regions formed in the active region AT1. The source/drain regions are formed to sandwich each of the gate electrodes G1 to G3 in a direction perpendicular to the direction in which each of the gate electrodes G1 to G3 extends, namely, in the gate length direction. The selection transistor SEL and the amplification transistor AMI, which are adjacent to each other, share, in the active region AT1, one of the source/drain regions of each of them.

A contact plug is electrically coupled to each of the gate electrodes G1 to G5. A contact plug CP (see FIG. 3) is electrically coupled to each of: the active region that forms the drain region of each of the forwarding transistors TX1 and TX2 and that is the aforementioned protruding portion; the pair of the source/drain regions of the resetting transistor RST; the source region that forms the selection transistor SEL; and the drain region of the amplification transistor AMI. A contact plug is not coupled to the upper surface of the source/drain region shared by the selection transistor SEL and the amplification transistor AMI.

Although not illustrated in FIG. 1, a plurality of wiring are formed in a layer above the gate electrodes G1 to G5 and the contact plugs. One of the plurality of wiring couples together the gate electrode G1 of the amplification transistor AMI, the source region of the resetting transistor RST, and the drain region of the forwarding transistor TX1 or TX2 formed in the aforementioned protruding portion. In the present embodiment, the photodiodes PD1 and PD2, which are adjacent to each other in First Direction, share the peripheral transistors formed between them.

Subsequently, a mode in which the photodiodes PD1 and PD2 and other field effect transistors, which form the pixels of the present embodiment, are coupled together, and operations of the pixel will be described with reference to FIG. 2.

As illustrated in FIG. 2, the anode of the photodiode PD1 is coupled to a ground potential. The gate electrode of each of the forwarding transistor TX1, the resetting transistor RST, and the selection transistor SEL is coupled to the line selection circuit (not illustrated). The drain region of each of the amplification transistor AMI and the resetting transistor RST is coupled to the line selection circuit.

The cathode of the photodiode PD1 is coupled to the source region of the forwarding transistor TX1. The drain region of the forwarding transistor TX1 is coupled to the source region of the resetting transistor RST and the gate electrode of the amplification transistor AMI via wiring M1 (see FIG. 4). The source region of the amplification transistor AMI and the drain region of the selection transistor SEL are coupled together, and the source region of the selection transistor SEL is coupled to the row selection circuit (not illustrated).

The peripheral transistors of the pixel form a source follower circuit that amplifies and outputs an electric charge obtained by the photodiode PD1, namely, a signal. The photodiode PD1 has a p-type diffusion layer formed over the upper surface of the semiconductor substrate and an n-type diffusion layer under the p-type diffusion layer, and when light enters the upper surface of the photodiode PD1, an electric charge is generated by photoelectric conversion. The electric charge thus generated is accumulated in the n-type diffusion layer.

The aforementioned electric charge is forwarded to the drain region of the forwarding transistor TX1, namely, to a floating diffusion region, and accumulated therein, when the forwarding transistor TX1 is an ON state. Thereby, the electric charge is forwarded to the gate electrode of the amplification transistor AMI coupled to the drain region of the forwarding transistor TX1. Thus, the forwarding transistor TX1 is a field effect transistor that reads out a signal electric charge generated in the photodiode PD1 to forward to a charge detector. The charge detector refers to the drain region of the forwarding transistor TX1, the gate electrode of the amplification transistor AMI, and the source region of the resetting transistor RST, which are coupled by wiring (not illustrated).

The photodiode PD2 and the forwarding transistor TX2 have the same structures as those of the photodiode PD1 and the forwarding transistor TX1, respectively, and the drain region of the forwarding transistor TX2 is coupled to the resetting transistor RST and the amplification transistor AMI to which the aforementioned forwarding transistor TX1 is coupled similarly.

The amplification transistor AMI is a field effect transistor that outputs an electric signal in accordance with the voltage of the gate electrode. Accordingly, the amplification transistor AMI outputs an electric signal in accordance with the amount of electric charges generated and accumulated by the photodiodes PD1 and PD2, namely, a pixel signal to the selection transistor SEL. That is, the amplification transistor AMI is a field effect transistor that outputs an electric signal corresponding to a potential variation in the charge detector.

Herein, an output signal of the amplification transistor AMI is outputted to the row selection circuit that is a readout circuit with the selection transistor SEL being caused to be in an ON state. That is, readout by a source follower becomes possible by the amplification transistor AMI and the selection transistor SEL. The resetting transistor RST has the role of resetting the electric charge accumulated in the drain region of each of the forwarding transistors TX1 and TX2, the drain region serving as a floating diffusion part by being caused to be in an ON state. That is, the resetting transistor RST is a field effect transistor that resets the potential of the aforementioned charge detector to a predetermined initial value.

A semiconductor device, in which two photodiodes PD1 and PD2 are coupled to the peripheral transistors via the forwarding transistors TX1 and TX2, respectively, has been described above; however, only one photodiode may be coupled to the peripheral transistors. That is, a photodiode and a peripheral transistor may be provided in each pixel in a similar layout.

Subsequently, FIG. 3 illustrates a planar layout in which the selection transistor SEL and the amplification transistor AMI in FIG. 1 are enlarged. As illustrated in FIG. 3, the gate electrodes G1 and G2 are formed over the active region AT1, and a contact plug CP is coupled to the upper surface of each of the gate electrodes G1 and G2, the source region of the selection transistor SEL, and the drain region of the amplification transistor AMI. The contact plug CP is coupled to the upper surface of one end portion in the gate width direction of the gate electrode G2. In FIG. 3, the boundary between the active region AT1 and the element isolation region STI in the region covered by each gate electrode is illustrated by a dashed line.

The gate electrode G1 has the gate electrode part GP, which is a gate electrode extending in First Direction, and the large width part GW, which is a gate electrode extending in Second Direction. One end portion of the gate electrode part GP formed immediately above the active region AT1 is formed to protrude, in plan view, toward the element isolation region STI beyond the boundary between the active region AT1 and the element isolation region STI in the gate width direction of the gate electrode G1. The other end portion of the gate electrode part GP in the same direction is coupled to the large width part GW in a portion immediately above the active region AT1.

The large width part GW extends in Second Direction along the boundary between the active region AT1 and the element isolation region STI, so as to cover part of the active region AT1. The contact plug CP is electrically coupled to the gate electrode G1 in one end portion in the gate width direction of the gate electrode G1 via the upper surface of the large width part GW extending in Second Direction. That is, the large width part GW has a role as gate wiring for supplying a potential to the gate electrode part GP.

Each of the gate electrode part GP and the large width part GW includes the same polysilicon pattern as that of the other. That is, the gate electrode part GP and the large width part GW form the gate electrode G1 having one gate pattern. That is, the gate electrode part GP and the large width part GW are integrated with each other. Accordingly, the large width part GW extends along the gate length direction of the gate electrode G1, and hence in the gate pattern of the gate electrode G1, the gate length of the large width part GW is larger than that of the gate electrode part GP.

In the present application, of a gate electrode having a layout in which a pattern extending in one direction is coupled to an end portion of another pattern extending in a direction perpendicular to the one direction, a pattern having a smaller gate length is referred to as a gate electrode part, while a pattern having a larger one is referred as a large width part. The gate electrode part and the large width part form the same gate pattern and are integrated with each other, but herein it is designed that the gate electrode part is coupled to the sidewall of the large width part. That is, one end portion in the extending direction of the gate electrode part is terminated at the sidewall of the large width part.

In the present embodiment, the large width part GW is formed only in one end portion in the gate width direction of the gate electrode part GP, and the other end portion of the gate electrode part GP has the same gate length as that of the central portion thereof. In other words, in the gate width direction of the gate electrode G1, one end portion of the gate electrode G1 and a portion thereof near the central portion of the active region AT1 have a first gate length, while the other end portion of the gate electrode G1 has a second gate length larger than the first gate length.

That is, the gate electrode G1 has both the gate electrode part GP having a first pattern extending in First Direction and the large width part having a second pattern extending in Second Direction, namely, a larger width pattern, and the second gate length of the second pattern is larger than the first gate length of the first pattern in a portion immediately above the active region AT1. That is, in a portion immediately above the active region AT1, the gate length of an end portion in the gate length direction of the gate electrode G1 is larger than that of the central portion in the same direction of the gate electrode G1.

The gate electrode G2 does not have a large width part, and hence is formed to have a constant gate length from one end portion to the other end portion in First Direction. That is, the gate length of the gate electrode G2 immediately above the boundary between the active region AT1 and the surrounding element isolation region STI is equal to that of the gate electrode G2 near the central portion of the active region AT1. This is also true for the end portion in the gate width direction of the gate electrode part GP, the end portion being located on the side not coupled to the large width part GW.

Thus, the large width part GW is formed to bestride the boundary between the active region AT1 and the element isolation region STI and to cover the upper surface of each of them. Because the large width part GW, which forms the end portion of the gate electrode G1, is formed to cover the upper surface of the active region AT1 adjacent to the aforementioned boundary, the gate electrode part GP, having a gate length smaller than that of the large width part GW, is arranged, in the gate pattern, so as to be far from the boundary immediately below the large width part GW by a certain distance. The main characteristic of the semiconductor device of the present embodiment is that, because the large width part GW having a gate length larger than that of the gate electrode part GP is formed, the gate electrode part GP is formed to be spaced apart from the aforementioned boundary.

Subsequently, the structure of the semiconductor device of the present embodiment will be described with reference to FIG. 4. FIG. 4 is a sectional view, taken along A-A Line in FIG. 3. That is, FIG. 4 illustrates the section of each of the selection transistor SEL and the amplification transistor AMI, in this order from the left of the view.

The non-illustrated resetting transistor RST (see FIG. 1) has the same structure as that of the selection transistor SEL or the amplification transistor AMI. However, the resetting transistor RST is not formed over the same active region as that for the other elements. Additionally, the photodiode PD1 (see FIG. 1) is formed on the source is region side of the non-illustrated forwarding transistor TX1 (see FIG. 1). Similarly, the photodiode PD2 (see FIG. 1) is formed on the source region side of the forwarding transistor TX2 (see FIG. 1).

As illustrated in FIG. 4, the semiconductor device of the present embodiment has a semiconductor substrate SB. A trench for element isolation, namely, an isolation trench is formed in the upper surface of the semiconductor substrate SB, and the element isolation region STI, including, for example, a silicon oxide film, etc., is embedded in the isolation trench. The upper surface of the semiconductor substrate SB exposed from the element isolation region STI is defined as the active region AT1 by the element isolation region STI. A p-type well PW, into which a relatively low concentration of p-type impurities (e.g., B (boron)) have been introduced, is formed from the upper surface of the semiconductor substrate SB exposed from the element isolation region STI to a region deeper than the element isolation region STI.

The amplification transistor AMI and the selection transistor SEL have the gate electrodes G1 and G2 formed over the semiconductor substrate SB and via a gate insulating film GF, respectively. Each of the gate electrodes G1 and G2 includes, for example, a polysilicon film, and the thickness thereof is, for example, 200 nm. A gate insulating film GF includes, for example, a silicon oxide film, and the thickness thereof is, for example, 7 to 10 nm.

Both the sidewalls of each of the gate electrodes G1 and G2 are covered by a sidewall SW. The sidewall SW formed in contact with both the sidewalls of each of the gate electrodes G1 and G2 is formed by: an insulating film including, for example, a silicon oxide film; an insulating film including a laminated film made by a silicon oxide film and a silicon nitride film; or the like.

A pair of source/drain regions, into which n-type impurities (e.g., P (phosphorus) or arsenic (As)) have been introduced, are formed in the upper surface of the semiconductor substrate SB beside each of the gate electrodes G1 and G2. Herein, the source/drain region of the non-illustrated forwarding transistor is not formed symmetrically. This is because the source region of the forwarding transistor includes part of the photodiode.

A pair of source/drain regions of each of the amplification transistor AMI and the selection transistor SEL have an extension region EX, which is an n-type semiconductor region, and a diffusion layer DF, which is an n-type semiconductor region. The extension region EX is formed in a region nearer to a channel region in the semiconductor substrate SB immediately below the gate electrode than to the diffusion layer DF.

The diffusion layer DF is a semiconductor region having a concentration of n-type impurities (e.g., P (phosphorus) or arsenic (As)) higher than that in the adjacent extension region EX. Thus, each source/drain region has an LDD (Lightly Doped Drain) structure in which the extension region EX having a relatively low concentration of impurities and the diffusion layer DF having a relatively high concentration of impurities are included. Herein, the depth where the p-type well PW is formed is deeper than the diffusion layer DF. The selection transistor SEL and the amplification transistor AMI, which are adjacent to each other, share the diffusion layer DF between them. In FIG. 4, the extension region EX formed to be shallower than the diffusion layer DF is illustrated; however, the depth where the extension region EX is formed may be deeper than that where the diffusion layer DF is formed.

Of a pair of source/drain regions that form the non-illustrated forwarding transistor, one of the regions includes a diffusion layer, which is an n-type semiconductor region that forms the photodiode. The photodiode is formed by an n-type diffusion layer, which is formed from the upper surface of the semiconductor substrate SB to a relatively deep position by introducing n-type impurities (e.g., P (phosphorus) or arsenic (As)), and a p-type diffusion layer, which is formed from the upper surface of the semiconductor substrate SB to a relatively shallow position by introducing p-type impurities (e.g., B (boron)). The n-type diffusion layer is formed in a portion deeper than the p-type diffusion layer.

In the active region AT1, the amplification transistor AMI has both the gate electrode G1 over the gate insulating film GF and a source/drain region including the extension region EX and the diffusion layer DF in the semiconductor substrate SB beside the gate electrode G1. Similarly, in the active region AT1, the selection transistor SEL has both the gate electrode G2 over the gate insulating film GF and a source/drain region including the extension region EX and the diffusion layer DF in the semiconductor substrate SB beside the gate electrode G2.

The non-illustrated forwarding transistors TX1 and TX2 (see FIG. 1) have: the gate electrodes G4 and G5 (see FIG. 1) over the gate insulating film; a drain region that includes the extension region EX and the diffusion layer DF and is formed in one of the semiconductor substrates SB beside each of the gate electrodes G4 and G5; and a source region formed in the other of the semiconductor substrates SB beside each of the gate electrodes G4 and G5.

As illustrated in FIG. 4, a silicide layer S1 is formed over the upper surface of each of the element isolation region STI, the gate insulating film GF, the diffusion layer DF exposed from the sidewall SW, and the gate electrodes G1 and G2. The silicide layer S1 includes, for example, $CoSi_2$ (cobalt silicide), and has the role of reducing the contact resistance between the contact plug CP and a semiconductor layer electrically coupled to the contact plug CP.

An etching stopper film ES and an interlayer insulating film CL are sequentially laminated over the semiconductor substrate SB so as to cover the element isolation region STI, the silicide layer S1, the selection transistor SEL, and the amplification transistor AMI. The contact plug CP mainly including, for example, W (tungsten) is formed in each of a plurality of contact holes each penetrating the interlayer insulating film CL. The etching stopper film ES includes, for example, a silicon nitride film, while the interlayer insulating film CL includes, for example, a silicon oxide film. The thickness of the etching stopper film ES is, for example, 30 nm.

The contact plugs CP are coupled to the source region of the selection transistor SEL and the drain region of the amplification transistor AMI via the silicide layer S1, respectively. In a non-illustrated region, the contact plugs are electrically coupled to the gate electrodes G1 and G2, respectively.

The upper surface of each of the contact plug CP and the interlayer insulating film CL is made flat such that the heights of them are equal to each other, and an interlayer insulating film IL, which is, for example, an SiOC film, is formed over the contact plug CP and the interlayer insulating film CL. A plurality of wiring trenches, each penetrating the interlayer insulating film IL, are formed in the interlayer insulating film IL, and wiring M1 mainly including Cu (copper) is formed in each of the wiring trenches. The upper surface of each of the wiring M1 and the interlayer insulating film IL is made flat such that the heights of them are equal to each other. The wiring M1 are electrically coupled to the selection transistor SEL and the amplification transistor AMI via the contact plugs CP, respectively.

Subsequently, the sectional view of the semiconductor device of the present embodiment illustrated in FIG. 5 will be described. FIG. 5 is a sectional view, taken along B-B Line in FIG. 3. FIG. 5 is a sectional view obtained by cutting the gate electrode part GP along the width direction of the gate electrode G1. As illustrated in FIG. 5, the active region AT1 is defined over the semiconductor substrate SB by being surrounded with the element isolation region STI. Although the p-type well PW is formed in the semiconductor substrate SB, there is a region in the semiconductor substrate SB immediately below each of the gate electrode part GP and the large width part GW, in which the extension region EX and the diffusion layer DF (see FIG. 4) are not formed. That is, the upper surface of the semiconductor substrate SB immediately below the gate electrode part GP forms the channel region of the amplification transistor AMI.

The gate electrode G1 formed over the semiconductor substrate SB via the gate insulating film GF is formed by the large width part GW located on the left side of the view and the gate electrode part GP formed from the central portion to the right side of the view. Herein, the upper side of the uppermost portion of the boundary between the element isolation region STI located on the left side of the view and the active region AT1 is covered by the large width part GW, while the upper side of the uppermost portion of the boundary between the element isolation region STI located on the right side of the view and the active region AT1 is covered by the gate electrode part GP. The gate electrode G1 is formed continuously from a portion immediately above one of both the element isolation regions STI, by which the active region AT1 is sandwiched, to a portion immediately above the other of both the element isolation regions STI.

Thus, the upper surface of the active region AT1, located near the boundary between one of the element isolation regions STI located in the gate width direction and the active region AT1, is covered by the large width part GW having a gate length larger than that of the gate electrode part GP, while the upper surface of the active region AT1 in the other regions is covered by the gate electrode part GP. The sidewall of the gate electrode G1 immediately above the element isolation region STI is covered by the sidewall SW. The silicide layer S1 is formed over the upper surface of the gate electrode G1 exposed from the gate insulating film GF, the element isolation region STI, and the sidewall SW. Further, the etching stopper film ES and the interlayer insulating films CL and IL are sequentially formed over the amplification transistor AMI including the gate electrode G1.

Subsequently, the sectional view of the semiconductor device of the present embodiment illustrated in FIG. 6 will be described. FIG. 6 is a sectional view, taken along C-C Line in FIG. 3. As illustrated in FIG. 6, the active region AT1 is defined over the semiconductor substrate SB by being surrounded with the element isolation region STI. The p-type well PW is formed in the semiconductor substrate SB, and the diffusion layer DF is formed in a region shallower than the p-type well PW, and the extension region EX is formed in a region shallower than the diffusion layer DF.

Herein, the upper side of the uppermost portion of the boundary between one of the element isolation regions STI located in the gate width direction and the active region AT1 is covered by the large width part GW formed over the gate insulating film GF. Unlike the structure illustrated in FIG. 5, however, the active region AT1 not covered by the large width part GW is not covered by the gate electrode part GP. The sidewalls on both sides of the large width part GW are covered by the sidewall SW. In a portion immediately below the large width part GW, there is a region where the extension region EX and the diffusion layer DF are not formed. This is because the extension region EX and the diffusion layer DF are formed in the semiconductor substrate SB by an ion implantation step in which the gate electrode G1 is used as a mask. Accordingly, the extension region EX and the diffusion layer DF are formed in a region not covered by the large width part GW.

The silicide layer S1 is formed over the upper surface of each of the diffusion layer DF, which forms the drain region of the amplification transistor AMI, and the large width part GW. Further, the etching stopper film ES, the interlayer insulating film CL, and the wiring M1 are sequentially formed over the amplification transistor AMI including the gate electrode G1. The contact plug CP penetrating the interlayer insulating film IL (see FIG. 4) electrically couples the wiring M1 and the diffusion layer DF together.

Figure 19:
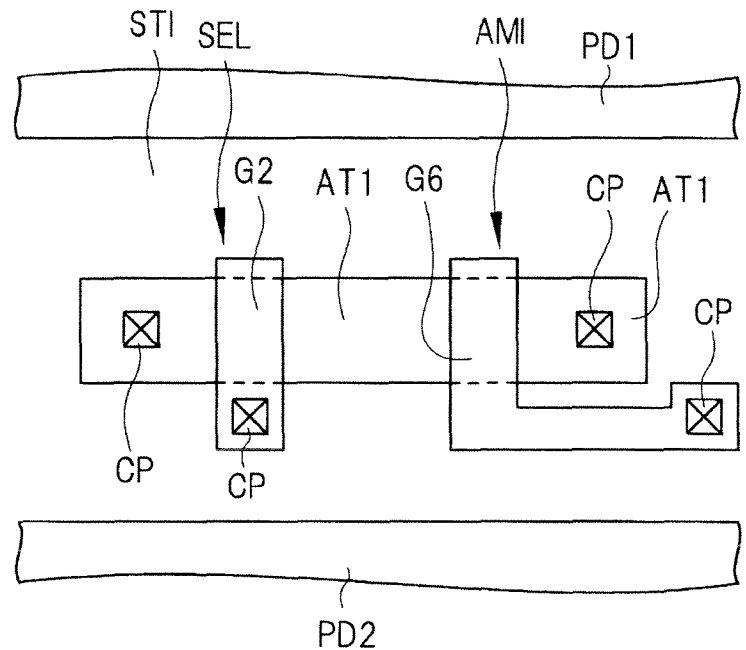
FIG. 19 is a planar layout illustrating a semiconductor device of a comparative example.

Hereinafter, the effects of the semiconductor device of the present embodiment will be described by using a semiconductor device of a comparative example illustrated in FIG. 19. FIG. 19 is a planar layout illustrating the semiconductor device of a comparative example.

When a picture is intended to be obtained by using an image pickup device, there is the problem that noise is generated in the picture, so that an accurate picture cannot be obtained. As one type of noise included in the noise, there is readout noise that is mixed in a signal when the signal is read out from the light receiving part. The readout noise includes, as a main component, 1/f noise that is generated: because a current flows in an active region that is located in a channel region of a peripheral transistor that forms a pixel and located near an element isolation region; or the like.

In an image pickup device that is the semiconductor device of the comparative example illustrated in FIG. 19, there is the problem that 1/f noise is increased because a current flows in an active region near an element isolation region, as described above.

In order to improve the performance of an image pickup device, it can be considered that a ratio of the occupation area of a photodiode to a main surface of the image pickup device is enhanced to increase a light receiving area. It can also be considered that the number of pixels per unit area is increased. In these cases, the area of a portion among a plurality of the photodiodes that form pixels, in the portion the peripheral transistor being able to be formed, is required to be reduced to secure the area of the photodiode as extensively as possible.

Herein, if a transistor is arranged by sequentially arraying the source region, the gate electrode, and the drain region thereof in a direction in which two photodiodes are adjacent to each other and between the two photodiodes, the occupancy of the area of the photodiode is decreased because the distance between the photodiodes is required to be increased, which deteriorates the performance of the image pickup device. That is, when a peripheral transistor is arranged between two photodiodes, it is not preferable that the gate length direction of the peripheral transistor is directed in the direction in which the two photodiodes are adjacent to each other, from the viewpoint of increasing the area of the photodiode.

Accordingly, in order to expand a region for a photodiode, it can be considered that the direction in which gate electrodes G2 and G6, which are arranged between photodiodes PD1 and PD2 and form a peripheral transistor, extend, namely, the gate width direction is caused to be the same as the direction in which the two photodiodes PD1 and PD2 are adjacent to each other, as illustrated in FIG. 19. That is, the gate width direction of the gate electrode G6 of an amplification transistor AMI is the same as the direction in which the photodiodes PD1 and PD2, arranged to sandwich the amplification transistor AMI, are adjacent to each other.

Herein, it is desirable that, particularly in the amplification transistor AMI of the peripheral transistors, the gate width of the gate electrode G6 is secured extensively, from the viewpoint of reducing readout noise. This is because: an output signal can be further enhanced by increasing the gate width of the gate electrode of a peripheral transistor, while suppressing an increase in noise; and the amplification transistor AMI is an element that provides a great impact particularly on an increase in readout noise. The methods of increasing the gate width include: one in which the distance in which the gate electrode extends is made large; and one in which the total gate width is made large by adopting a comb-like gate structure in which a plurality of gate electrodes, namely, a plurality of fingers, which are arranged in parallel with each other in the gate length direction, are coupled together.

However, it is difficult to increase the gate width by extending the gate electrode G6 of the amplification transistor AMI, in a narrow region between the photodiodes PD1 and PD2 having a large area occupancy in the pixel, as illustrated in FIG. 19. Herein, FIG. 19 illustrates the amplification transistor AMI including only one gate electrode G6, not adopting a structure in which the number of fingers is increased, as described above.

Multiple causes from which 1/f noise is generated are considered, but one of them is that a current flows in the active region AT1 near the element isolation region STI under the gate electrode G6 of the amplification transistor AMI. As described later with reference to FIGS. 8 and 9, 1/f noise is more remarkably generated with a current flowing in the active region AT1 near the element isolation region STI, as the gate width of the gate electrode G6 is smaller. That is, if the area of the photodiodes PD1 and PD2 is increased, the area of a region where a peripheral transistor is formed is decreased, which leads to a decrease in the gate width of the gate electrode G6 of the amplification transistor AMI, thereby causing 1/f noise to be generated remarkably.

Herein, the fact that a current flows in the active region near the element isolation region refers to the fact that, in a portion immediately below the gate electrode G6 illustrated in FIG. 19, a channel is formed in the active region AT1 near the boundary between the element isolation region STI and active region AT1 and when the amplification transistor AMI is operated, an electron moves in a region located in the channel between the source/drain regions and located near the element isolation region STI.

So, in order to prevent occurrence of 1/f noise, the present inventors have investigated that a current is prevented from flowing in the active region near the element isolation region. As a result, the inventors have found that a channel can be prevented from being formed in the active region immediately below a large width part in which the gate length of the gate electrode is made large, by forming the large width part immediately above the boundary between the element isolation region and the active region such that the source/drain regions, which sandwich the large width part, are spaced apart from each other.

A semiconductor device in which this configuration has been realized is the image pickup device of the present embodiment described with reference to FIGS. 1 to 6. In the semiconductor device of the embodiment, the large width part GW is formed in one end portion in the gate width direction of the gate electrode G1, and the gate electrode part GP, having a gate length smaller than that of the large width part GW, is arranged to be spaced apart from the boundary between the element isolation region STI and the active region AT1, as illustrated in FIG. 3. In this structure, when the amplification transistor AMI is operated, the resistance of the main surface of the semiconductor substrate immediately below the large width part GW becomes larger than that of the main surface immediately below the gate electrode part GP, and hence a current between the source/drain regions flows immediately below the gate electrode part GP. That is, a current can be prevented from flowing in the active region AT1 located immediately below the large width part GW and located near the boundary between the element isolation region STI and the active region AT1.

As a result, occurrence of the 1/f noise, generated because a current flows in the active region AT1 near the boundary between the element isolation region STI and the active region AT1, can be prevented. Accordingly, readout noise can be reduced in the image pickup device, and hence the performance of the semiconductor device can be improved.

As described later with reference to FIGS. 8 and 9, a configuration, in which a current is prevented from flowing in the active region near the boundary between the element isolation region and the active region, is effective particularly in an image pickup device including a peripheral transistor having a small gate width, from the viewpoint of reducing 1/f noise.

Figure 7:
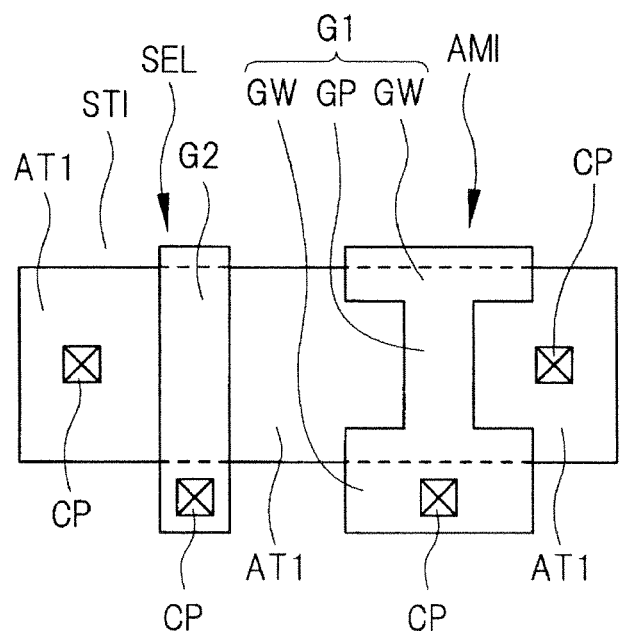
FIG. 7 is a planar layout illustrating a semiconductor device according to a variation of First Embodiment of the invention.

Subsequently, a variation of the semiconductor device of the present embodiment will be described with reference to FIG. 7. FIG. 7 is a planar layout illustrating enlarged part of an image pickup device that is a variation of the semiconductor device of the embodiment, and the view illustrates a layout of the selection transistor SEL and the amplification transistor AMI located in a portion corresponding to that in FIG. 3. The present variation is different from the semiconductor device described with reference to FIGS. 1 to 6 in that the large width part GW is formed in each of both ends in the gate width direction of the gate electrode G1, as illustrated in FIG. 7. That is, in the amplification transistor AMI illustrated in FIG. 3, only one end portion in the gate width direction of the gate electrode G1 is formed to have a gate length larger than that of the gate electrode part GP, but in the variation illustrated in FIG. 7, each of both end portions in the gate width direction of the gate electrode G1 is formed to have a gate length larger than that of the gate electrode part GP.

Additionally, in FIG. 7, the large width part GW is not further extended in the direction in which it extends, in comparison with the structure illustrated in FIG. 3, and the contact plug CP is coupled to the upper surface at the central portion of the large width part GW. Thus, a mode in which the contact plug CP is coupled to the gate electrode G1 can be selected from various ones.

In the present variation, it is made possible that a region, in which the boundary between the active region AT1 and the element isolation region STI overlaps the gate electrode G1 in plan view, is wholly covered by the large width part GW by forming the large width parts GW in both end portions in the gate width direction of the gate electrode G1 of the amplification transistor AMI. Thereby, a current can be prevented from flowing in the active region AT1 located immediately below both end portions in the gate width direction of the gate electrode G1 and located near the boundary between the active region AT1 and the element isolation region STI. Accordingly, 1/f noise can be further reduced in comparison with the semiconductor device illustrated in FIGS. 1 to 6.

Herein, the difference in the effects of the semiconductor device of the present embodiment in the respective cases where the gate width of the peripheral transistor is large and small will be described with reference to FIGS. 8 and 9. FIGS. 8 and 9 are graphs for explaining an amount of change in noise.

Figure 8:
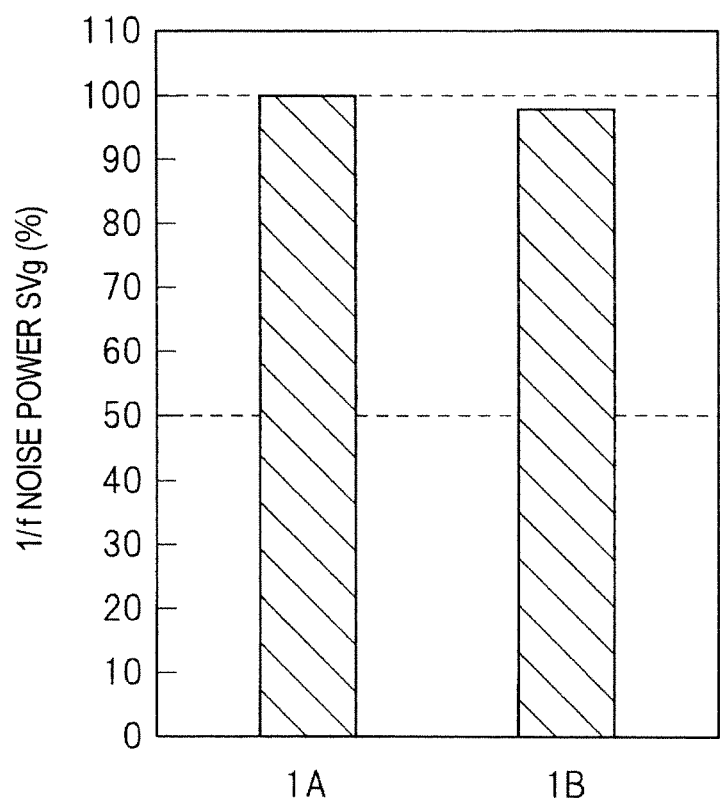
FIG. 8 is a graph for explaining an amount of change in noise.
Figure 9:
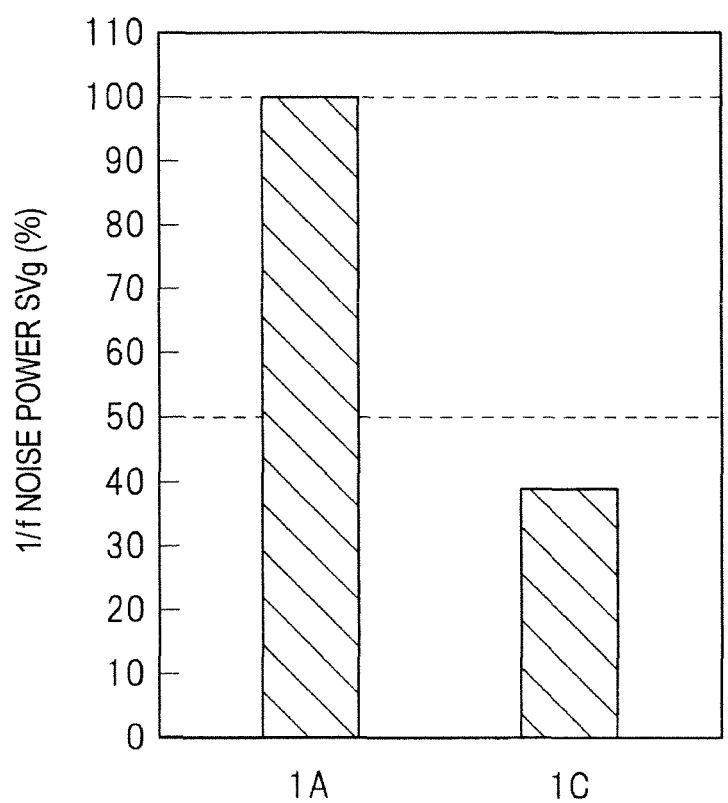
FIG. 9 is a graph for explaining an amount of change in noise.

Each of FIGS. 8 and 9 is a graph whose vertical axis represents 1/f noise power Svg of the amplification transistor, namely, a current noise spectral density of 1/f noise. That is, the vertical axis of each of FIGS. 8 and 9 illustrates an amount of 1/f noise. On the left side of the graph of each of FIGS. 8 and 9, a bar graph 1A, which is defined with the value of a 1/f noise amount in the amplification transistor AMI of the comparative example illustrated in FIG. 19 being set to 100, is illustrated. On the right side of the graph of each of FIGS. 8 and 9, a bar graph 1B or 1C is illustrated, the 1B or 1C showing an amount of 1/f noise generated in the amplification transistor AMI including the gate electrode G1 having the large width parts GW in both ends in the gate width direction, as illustrated in FIG. 7.

That is, FIG. 8 illustrates the bar graph 1A that shows an amount of 1/f noise in the amplification transistor of the comparative example and the bar graph 1B that shows an amount of 1/f noise in an amplification transistor having the same structure as that in the semiconductor device of the present embodiment. FIG. 9 illustrates the bar graph 1A that shows an amount of 1/f noise in the amplification transistor of the comparative example and the bar graph 10 that shows an amount of 1/f noise in an amplification transistor having the same structure as that in the semiconductor device of the present embodiment. Each of the bar graphs 1B and 1C shows an amount of 1/f noise in the amplification transistor of the semiconductor device of the present embodiment in comparison with an amount of 1/f noise in the amplification transistor of the comparative example, the latter amount of 1/f noise being set to be 100.

Each of the bar graphs in FIG. 8 shows an amount of 1/f noise, when it is assumed that the gate length of the gate electrode of the amplification transistor is 0.4 µm and the gate width is 9.6 µm, while each of the bar graphs in FIG. 9 shows an amount of 1/f noise, when it is assumed that the gate length of the gate electrode of the amplification transistor is 0.4 µm and the gate width is 3.2 µm.

In other words, when it is assumed that the gate width is W and the gate length is L, L/W=0.4/9.6 in FIG. 8 and L/W=0.4/3.2 in FIG. 9. Accordingly, the L/W ratio in an image pickup device that is a measurement target in FIG. 9 is larger than that in an image pickup device that is a measurement target in FIG. 8.

That is, the ratio of the gate width of the gate electrode of the amplification transistor to the gate length thereof is smaller in an image pickup device that is a measurement target in FIG. 9 than that in an image pickup device that is a measurement target in FIG. 8. Herein, in a semiconductor device in which the occupation area of a photodiode is increased and that of a region where a peripheral transistor is formed is reduced, the gate width of the gate electrode of an amplification transistor becomes small. Accordingly, when the gate structure of the semiconductor device of the present embodiment is applied to such a semiconductor device, a result of measuring 1/f noise in an amplification transistor becomes closer to the bar graph 1C illustrated on the right side of FIG. 9 than to the bar graph 1B in FIG. 8.

As illustrated in FIG. 8, in an amplification transistor having a large gate width with respect to the gate length, the difference between the bar graphs 1A and 1B is small, and hence it can be known that an amount of decrease in 1/f noise in the amplification transistor to which the gate structure of the semiconductor device of the present embodiment is applied is small with respect to the comparative example. This means that, in a transistor having a large gate width, the ratio of the noise, generated because a current flows in the active region near the element isolation region, to the 1/f noise component generated in the whole transistor is small.

That is, in an amplification transistor having a relatively large gate width with respect to a gate length, the ratio of a current flowing in the active region near the element isolation region becomes small, and hence the ratio of the 1/f noise, generated because a current flows near the element isolation region, to the 1/f noise component generated in the whole amplification transistor becomes small. Accordingly, even if a large width part is formed in an amplification transistor including a gate electrode having such a layout to reduce the 1/f noise generated because a current flows near the element isolation region, the effect of reducing noise with respect to the 1/f noise generated in the whole amplification transistor is small.

On the other hand, in an amplification transistor having a relatively small gate width with respect to a gate length, the value of the bar graph 1C is greatly smaller than that of the bar graph 1A, as illustrated in FIG. 9. From this, it can be known that, in an amplification transistor to which the gate structure of the semiconductor device of the present embodiment illustrated in FIG. 7 is applied, an amount of 1/f noise can be further reduced with respect to the amplification transistor illustrated in the aforementioned comparative example. The reason why, in the bar graph 1C in FIG. 9, an amount of decrease in 1/f noise with respect to the bar graph 1A is larger than that in the bar graph 1B in FIG. 8 is because the ratio of the noise, generated because a current flows in the active region near the element isolation region, to the 1/f noise generated in the whole transistor becomes larger, as the gate width of the transistor becomes smaller.

That is, as the gate width is smaller, the noise, generated because a current flows in the active region near the element isolation region, becomes more dominant in the 1/f noise in a transistor. Accordingly, in a semiconductor device in which the occupation area of a photodiode is made large in the top surface of an image pickup device, 1/f noise can be effectively reduced by applying the gate structure of the present embodiment, by which the noise generated due to the cause can be prevented from being generated, to the gate electrode of an amplification transistor. That is, the effects of the semiconductor device of the embodiment can be obtained more remarkably as the gate width of a transistor is smaller.

As described above, when the gate structure of the present embodiment is adopted, 1/f noise can be effectively reduced in a device in which the performance of an image pickup device is improved by causing the occupation area of a photodiode to be large, and hence the performance of a semiconductor device can be improved.

Second Embodiment

Figure 10:
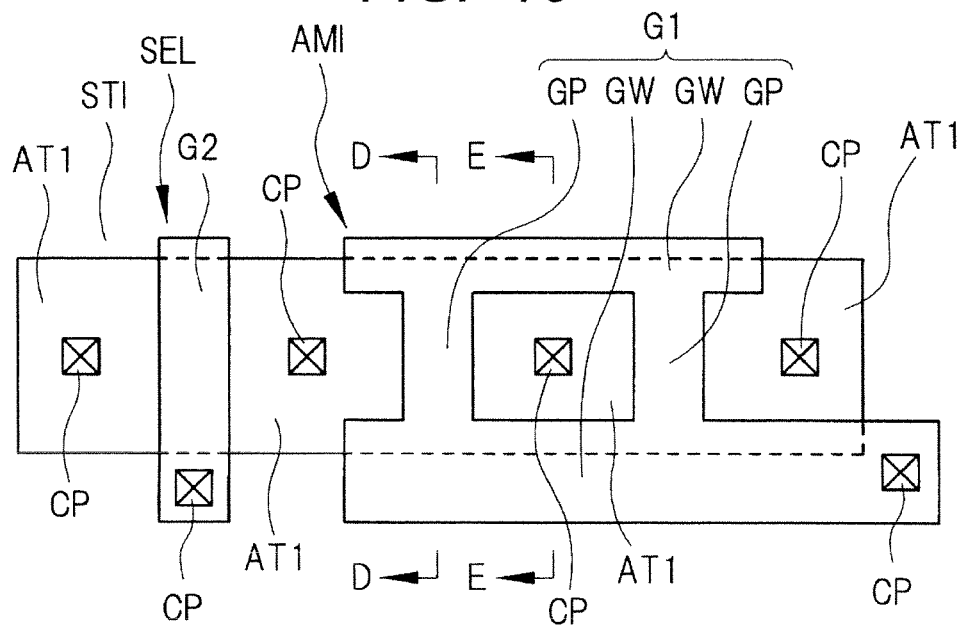
FIG. 10 is a planar layout illustrating a semiconductor device according to Second Embodiment of the invention.
Figure 11:
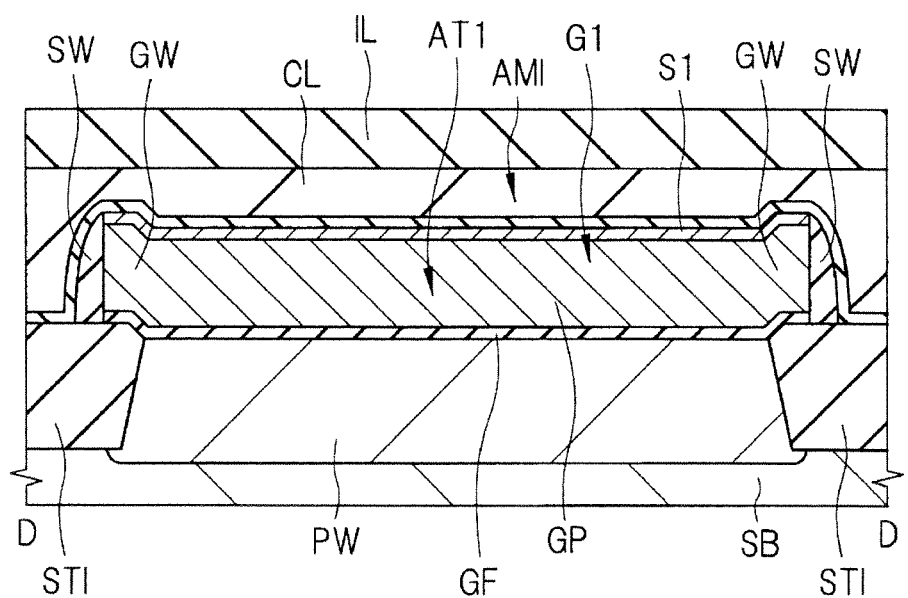
FIG. 11 is a sectional view, taken along D-D Line in FIG. 10.
Figure 12:
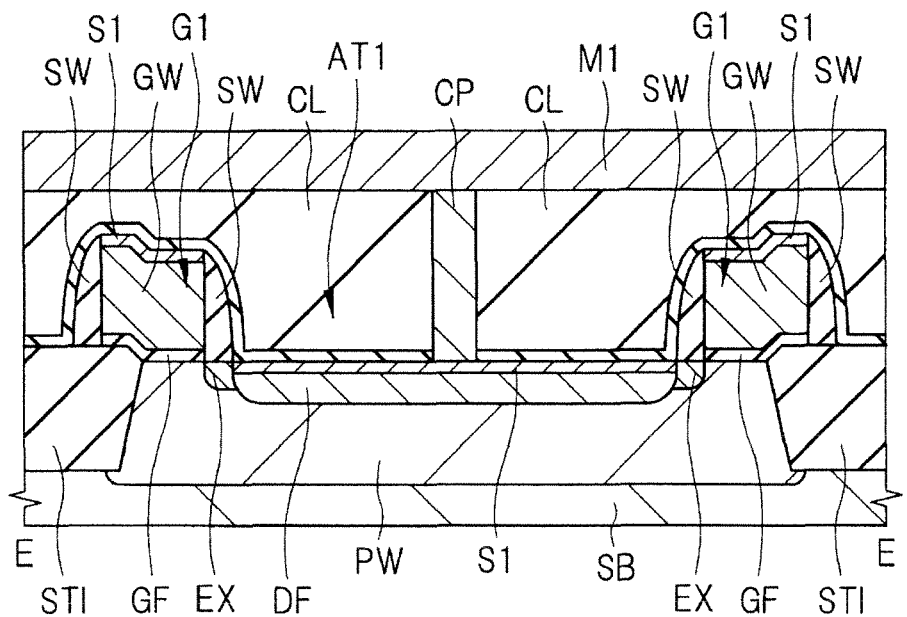
FIG. 12 is a sectional view, taken along E-E Line in FIG. 10.

In the present embodiment, a semiconductor device, in which an effective gate width is made large by causing the number of the gate electrodes of an amplification transistor to be two or more, will be described with reference to FIGS. 10 to 12. A structure in which large width parts are formed in both ends in the gate width direction of a gate electrode, namely, a structure similar to that of the variation of First Embodiment (see FIG. 7) will be described with reference to FIGS. 10 to 12; however, the effect of reducing 1/f noise can be obtained even in the case where a large width part is formed only in one end portion in the gate width direction of a gate electrode, as descried later with reference to FIG. 13. FIG. 10 is a planar layout illustrating a semiconductor device of the embodiment. FIG. 11 is a sectional view, taken along D-D Line in FIG. 10. FIG. 12 is a sectional view, taken along E-E Line in FIG. 10.

FIG. 10 illustrates a planar layout of a portion corresponding to that in FIG. 3. In the semiconductor device of the present embodiment, the structures of a photodiode, a forwarding transistor, and a resetting transistor, etc., are the same as those illustrated in FIG. 1. A major difference between the semiconductor device of the embodiment and that of First Embodiment is that the number of the gate electrodes of an amplification transistor is two, not one, and the two gate electrodes form a single gate electrode by being coupled together with a large width part. In FIG. 10, the boundary between the active region AT1 and the element isolation region STI in the region covered by each gate electrode is illustrated by a dashed line.

As illustrated in FIG. 10, two gate electrode parts GP each extending in First Direction, one gate electrode G2 extending in First Direction, and two large width parts GW each extending in Second Direction are formed immediately above an active region AT1. The large width part GW is coupled to one end portion in the gate width direction of each of the two gate electrode parts GP that are fingers of the gate electrode G1, and the other large width part GW is coupled to the other end portion. Thus, the gate electrode G1 is formed by the two large width parts GW and the two gate electrode parts GP. Similarly to the gate electrode G1 illustrated in FIG. 7, each of the two large width parts GW illustrated in FIG. 10 extends along the boundary between the active region AT1 and an element isolation region STI, so that the boundary and the upper surface of the active region AT1 near the boundary are covered.

In the present embodiment, a configuration, in which the number of the fingers of the gate electrode G1 of the amplification transistor AMI is increased, is adopted to increase the area of a photodiode and the gate width of the amplification transistor AMI. That is, by causing the number of the gate electrode parts GP that form the gate electrode G1 to be two or more and by coupling a plurality of the gate electrode parts GP arrayed in Second Direction to the large width parts GW, it is made possible to increase the effective gate width of the single gate electrode G1.

The drain region of the amplification transistor AMI is formed in the active region AT1 between the two gate electrode parts GP illustrated in FIG. 10, and a contact plug CP is coupled to the upper surface of the drain region. Additionally, the source region of the amplification transistor AMI is formed in the active region AT1 that is located beside each of the two gate electrode parts GP and located on the side opposite to the side where the aforementioned drain region is formed.

That is, the amplification transistor AMI has two source regions, which are electrically coupled together via both contact plugs CP coupled to the upper portions thereof and wiring (not illustrated). Accordingly, a contact plug CP is coupled to the upper surface of the source/drain region shared by the selection transistor SEL and the amplification transistor AMI, unlike the configuration of First Embodiment.

Subsequently, FIG. 11 is a sectional view obtained by cutting one gate electrode part GP, which forms the gate electrode G1 of the amplification transistor AMI, along the gate width direction. The structure illustrated in FIG. 11 is almost the same as that illustrated in FIG. 5, but the gate electrode part GP is arranged to be sandwiched by the two large width parts GW, and each of both ends in the gate width direction of the gate electrode part GP does not reach a portion immediately above the boundary between the element isolation region STI and the active region AT1. That is, the large width part GW, having a gate length larger than that of the gate electrode part GP, is arranged immediately above the boundary where each of both the sidewalls in the gate width direction of the active region AT1 contacts the element isolation region STI. Accordingly, the upper surface of the active region AT1, adjacent to the boundary in each of both ends of the active region AT1, is covered by the large width part GW.

Subsequently, FIG. 12 is a sectional view obtained by cutting the drain region of the amplification transistor AMI along the gate width direction. The structure illustrated in FIG. 12 is similar to that illustrated in FIG. 6, but is different from the structure of First Embodiment in that the large width part GW is arranged immediately above the boundary where each of the sidewalls on both sides in the gate width direction of the active region AT1 contacts the element isolation region STI. That is, the large width part GW is formed immediately above each of both ends in the gate width direction of the active region AT1, and the upper surface of the semiconductor substrate SB between those large width parts GW is exposed from a gate pattern.

A diffusion layer DF and an extension region EX are formed over and in the upper surface of the active region AT1 exposed from the two large width parts GW. On the other hand, there is a region, in which the diffusion layer DF and the extension region EX are not formed, in the upper surface of the active region AT1 not exposed from the two large width parts GW.

Figure 20:
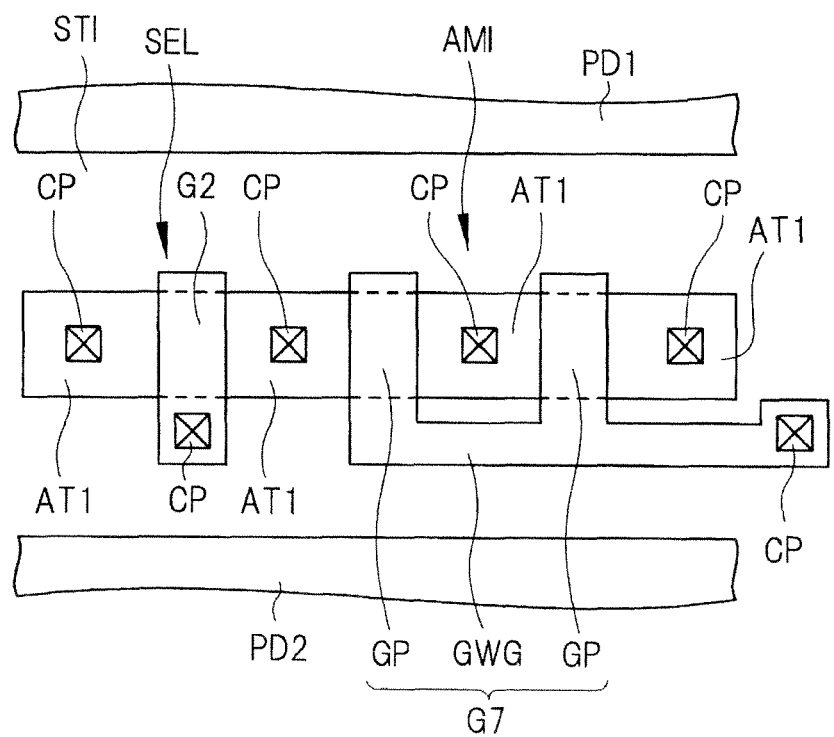
FIG. 20 is a planar layout illustrating a semiconductor device of a comparative example.

Subsequently, the effects of the semiconductor device of the present embodiment will be described with reference to FIG. 20 illustrating a planar layout of a semiconductor device of a comparative example. FIG. 20 is a planar layout of a portion corresponding to that in FIG. 19. An image pickup device of a comparative example illustrated in FIG. 20 has a layout similar to that of the image pickup device described with reference to FIG. 19, but is different from the structure illustrated in FIG. 19 in that two gate electrode parts GP are provided.

When the area occupancy of a photodiode in an image pickup device is increased, it becomes difficult to greatly secure the gate width of the gate electrode of a peripheral transistor, as described with reference to FIG. 1. A decrease in the gate width of an amplification transistor provides a great impact on an increase in 1/f noise, but when an effective gate width is made large by increasing the number of the gate electrodes of the amplification transistor AMI, 1/f noise can be reduced. So, in the semiconductor device of a comparative example illustrated in FIG. 20, two gate electrode parts GP that form a gate electrode G7 of an amplification transistor AMI are arranged, and those gate electrode parts GP are electrically coupled together by gate wiring GWG immediately above an element isolation region STI. The two gate electrode parts GP and the gate wiring GWG form the single gate electrode G7.

Herein, a contact plug CP is coupled to the upper surface of the source/drain region shared by the amplification transistor AMI and the selection transistor SEL, unlike the device illustrated in FIG. 19. The gate wiring GWG is not formed immediately above the boundary between the active region AT1 and the element isolation region STI and immediately above the active region AT1, unlike the large width part GW (see FIG. 10)

That is, the gate wiring GWG is formed only immediately above the element isolation region STI, and has the role of coupling the two gate electrode parts GP together and the role of pulling out a gate pattern to a supply part where a contact plug CP is coupled to the gate electrode G7. Accordingly, even when the gate wiring GWG is provided, there is no effect of reducing the 1/f noise generated because a current flows in the active region AT1 near the boundary between the active region AT1 and the element isolation region STI.

In a configuration in which the occupation area of photodiodes PD1 and PD2 is expanded, it can be considered that the effective gate width of the gate electrode G7 is increased by causing the number of the gate electrode parts GP of the amplification transistor AMI to be two or more as illustrated in FIG. 20, from the viewpoint of reducing 1/f noise.

On the other hand, when the gate width of each gate electrode, namely, the gate width of each gate electrode part GP is small, there is the problem that the 1/f noise, generated because a current flows in the active region AT1 near the boundary between the active region AT1 and the element isolation region STI, is increased, as described with reference to FIGS. 8 and 9. In particular, when the number of the gate electrode parts GP is increased to two or more, as in the comparative example illustrated in FIG. 20, the number of the portions, in each of which the gate electrode G7 overlaps the aforementioned boundary, is increased, and hence there is the problem that the 1/f noise, generated because a current flows in the active region AT1 near the boundary, is remarkably increased. That is, when the number of fingers is increased, as illustrated in FIG. 20, 1/f noise is further increased, in comparison with the comparative example illustrated in FIG. 19.

On the other hand, in the semiconductor device of the present embodiment illustrated in FIG. 10, the boundary between the active region AT1 and the element isolation region STI and the active region AT1 near the boundary are covered by the large width part GW having a gate length larger than that of the gate electrode part GP. That is, the gate electrode part GP, which is a gate electrode having a gate length smaller than that of the large width part GW, is spaced apart from the boundary by covering the active region AT1, near the boundary located in the direction in which the gate electrode part GP is elongated, with the large width part GW.

Because the source/drain region of the amplification transistor AMI is formed in the active region AT1 by using the gate electrode G1 as a mask, the source/drain region is hardly formed in a region immediately below the large width part GW. Additionally, because the large width part GW has a large gate length, a pair of the source/drain regions are greatly spaced apart from each other, even if the source/drain regions are formed to sandwich the large width part GW.

Accordingly, when the amplification transistor AMI is operated, the resistance of the active region AT1 immediately below the large width part GW, namely, the resistance of the active region AT1 near the aforementioned boundary becomes higher than that of the channel region immediately below the gate electrode part GP. Accordingly, a channel is hardly formed immediately below the large width part GW, and hence a current can be prevented from flowing in the active region AT1 near the aforementioned boundary immediately below the gate electrode G1. Accordingly, occurrence of the 1/f noise, generated because a current flows in the active region AT1 near the boundary, can be prevented. Thereby, readout noise in an image pickup device can be reduced while the occupation area of a photodiode is expanded, and hence the performance of a semiconductor device can be improved.

Figure 13:
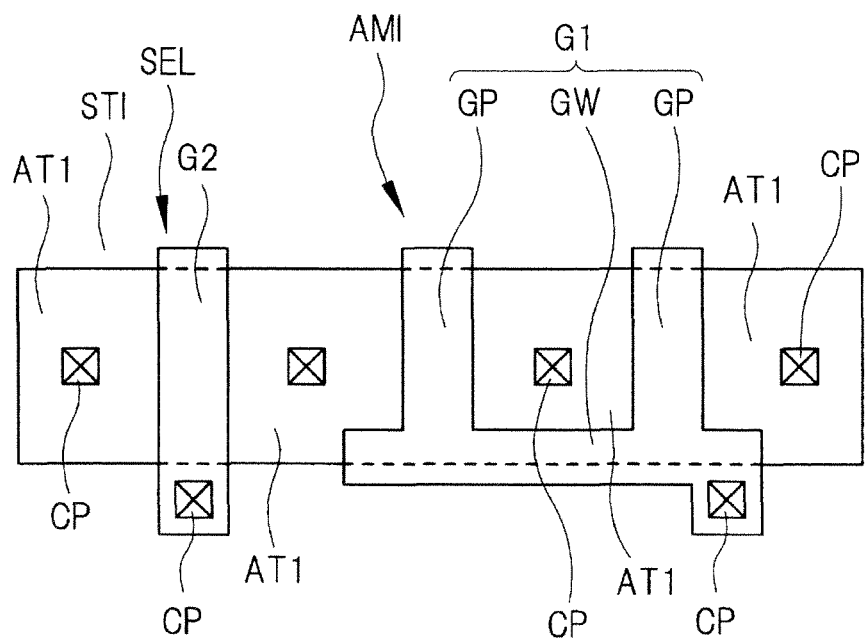
FIG. 13 is a planar layout illustrating a semiconductor device according to a variation of Second Embodiment of the invention.

Subsequently, FIG. 13 illustrates a planar layout of a semiconductor device of a variation of the present embodiment. FIG. 13 is a planar layout of a portion corresponding to that in FIG. 10. The difference between an amplification transistor AMI of the variation illustrated in FIG. 13 and the amplification transistor AMI described with reference to FIG. 10 is that, in the variation illustrated in FIG. 13, the large width part GW is coupled only to one end portion in the gate width direction of the gate electrode part GP. Accordingly, in the other end portion of the gate electrode part GP, the gate electrode part GP, having a gate length smaller than that of the large width part GW, extends so as to cover the boundary between the active region AT1 and the element isolation region STI and the upper portion of the active region AT1 near the boundary.

Even when the large width part GW is formed only in one end portion in the gate width direction of the gate electrode part GP, a current can be prevented from flowing in the active region AT1 near the boundary immediately below the large width part GW, as described with reference to FIGS. 1 to 6 in First Embodiment, and hence the effect of reducing 1/f noise can be obtained. In the case where the large width part GW is formed only in one end portion in the gate width direction of the gate electrode part GP, as illustrated in FIG. 13, the amplification transistor AMI can be formed in a narrower region than the case where the large width parts are formed in both ends in the gate width direction of the gate electrode part GP, and hence the occupancy of a photodiode can be enhanced.

Additionally, a configuration has been illustrated in FIG. 10, in which: the large width part GW is caused to further extend to the outside of the end portion of the active region AT1 in the direction in which the large width part GW extends, namely, in Second Direction; and the contact plug CP is coupled to the upper surface of the end portion located at the front to which the large width part GW is caused to extend. On the other hand, in the variation illustrated in FIG. 13, a structure is adopted, in which: the pattern of the large width part GW is caused to extend, in the gate width direction of the gate electrode part GP, toward the element isolation region STI from the end portion of the large width part GW in the direction in which the large width part GW extends; and a contact plug CP is coupled to the upper surface of the end portion at the front of the extended portion. Thus, a mode in which the contact plug CP is coupled to the gate electrode G1 can be selected from various ones.

Figure 14:
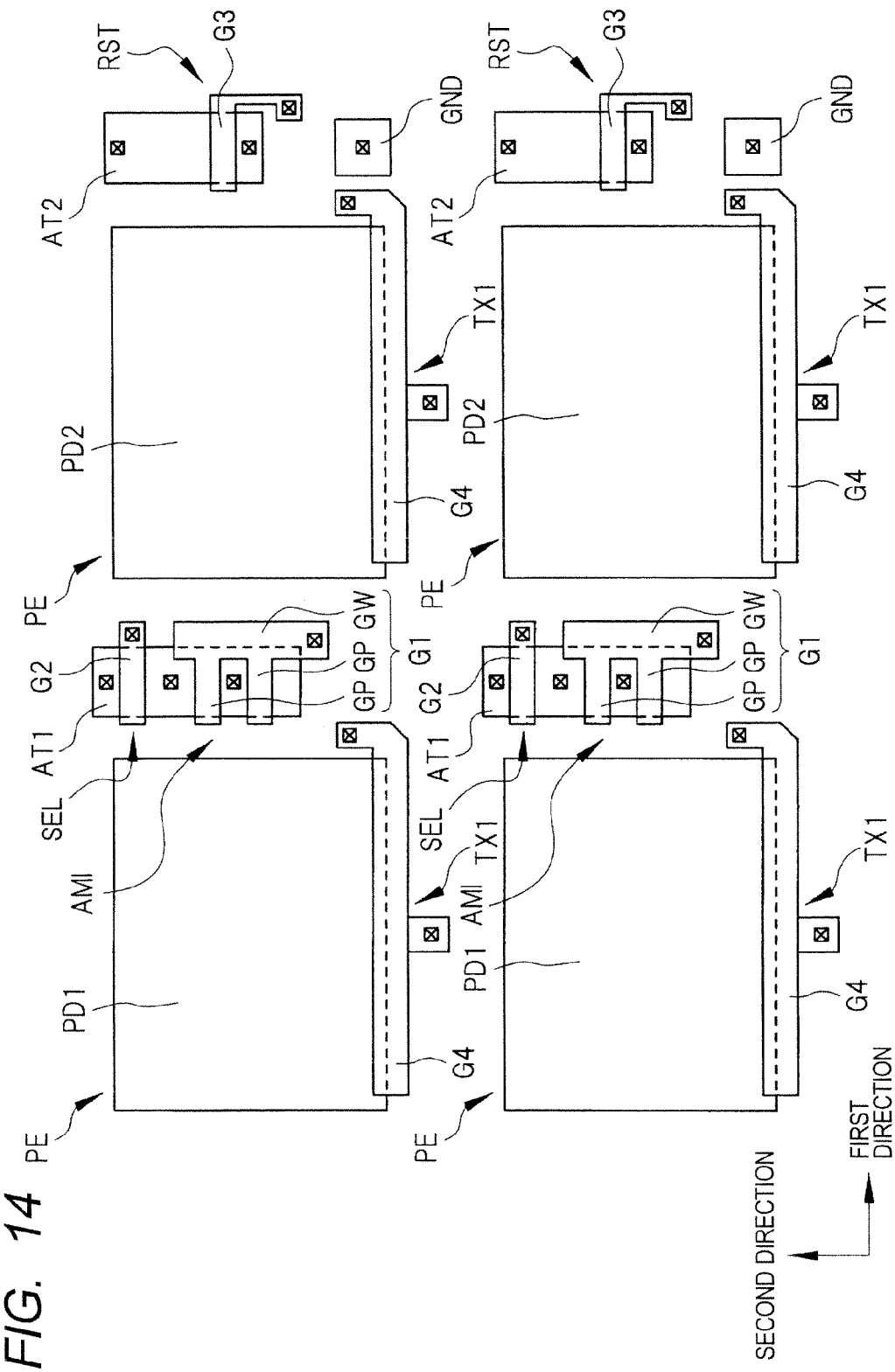
FIG. 14 is a planar layout illustrating a semiconductor device according to a variation of Second Embodiment of the invention.

Subsequently, FIG. 14 illustrates a planar layout of another variation of the semiconductor device of the present embodiment. FIG. 14 illustrates a layout of a plurality of pixels, the layout being obtained when the directions, in each of which the gate electrode of each transistor including a forwarding transistor, a resetting transistor, a selection transistor, and an amplification transistor extends, are caused to be the same as each other, unlike the configuration described with reference to FIG. 1. Of the pixels PE arrayed in a matrix pattern, four pixels PE are illustrated in FIG. 14. Herein, two photodiodes PD1 arrayed in Second Direction and two photodiode PD2 arrayed in Second Direction are illustrated, respectively. The photodiodes PD1 and PD2 are arranged alternately in First Direction. Each pixel PE has one photodiode PD1 or PD2.

A gate electrode G4 is formed along one side of each of the photodiodes PD1 and PD2, and the gate electrode G4, a drain region that is an active region protruding from the one side of the photodiode PD1 or PD2, and a source region that is an n-type diffusion layer forming the photodiode PD1 or PD2 form a forwarding transistor TX1. The aforementioned protruding portion is shared by the forwarding transistors TX1 and TX2 in FIG. 1; however, the drain region of each forwarding transistor TX1 is not shared by other forwarding transistors TX1 in FIG. 14.

Each of a selection transistor SEL and an amplification transistor AMI, which are located over the active region AT1 arranged between the photodiodes PD1 and PD2 in First Direction, is formed to have the same structure as that described with reference to FIG. 10. However, the active region AT2 and the resetting transistor are not arranged in the region between the photodiodes PD1 and PD2, in the region the active region AT1 being arranged, unlike the structure of FIG. 1.

The resetting transistor RST and the active region AT2 are arranged between the photodiodes PD2 and PD1 that are adjacent to each other in First Direction, and the selection transistor SEL, the amplification transistor AMI, and the active region AT1 are arranged between the photodiode PD2 and another photodiode PD1 adjacent to the photodiode PD2 in First Direction. That is, the selection transistor SEL and the amplification transistor AMI are formed, outside one side of the photodiode PD1 or PD2 in First Direction, to be adjacent to the photodiode PD1 or PD2, and the resetting transistor RST is formed, outside the other side thereof, to be adjacent to the photodiode PD1 or PD2. In other words, the photodiode PD1 or PD2 is arranged, in First Direction, between the selection transistor SEL and the amplification transistor AMI, and the resetting transistor RST.

Additionally, a grounding portion GND, which is an active region for supplying a ground potential, is formed between the photodiodes PD1 and PD2 and near the active region AT2, and a contact plug is coupled to the upper surface of the grounding portion GND. The grounding portion is formed in a non-illustrated region also in the image pickup device described with reference to FIG. 1. Each pixel PE of the present variation operates in the same way as that described with reference to FIG. 2.

In the present variation, the gate width direction of each of the gate electrodes G1, G2, G3, and G4, which are respectively included in the amplification transistor AMI, the selection transistor SEL, the resetting transistor RST, and the forwarding transistor TX1, is directed in the same direction as those of the others.

In the present variation, the same effect as that in the semiconductor device of the present embodiment described with reference to FIGS. 10 to 12 can also be obtained. That is, a layout of the photodiodes and each transistor that form the pixel can be selected from various ones. In the layout illustrated in FIG. 14, a configuration may be adopted, in which the gate electrode G1 is formed by only one gate electrode part GP, similarly to First Embodiment.

Third Embodiment

Figure 15:
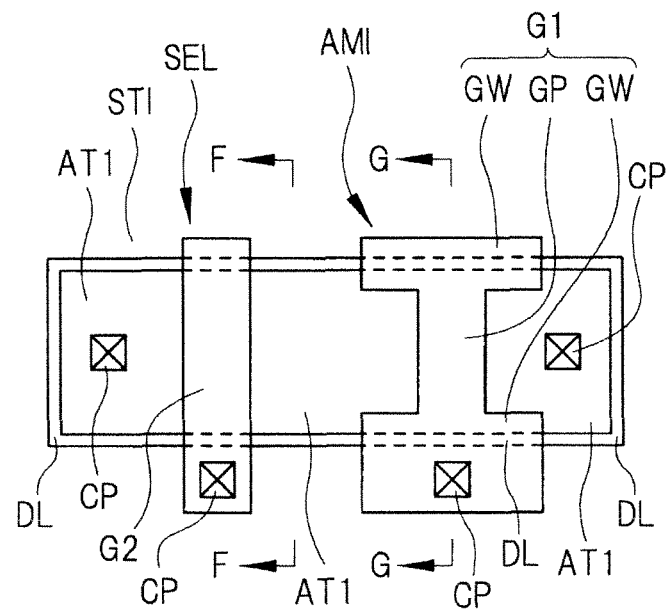
FIG. 15 is a planar layout illustrating a semiconductor device according to Third Embodiment of the invention.
Figure 16:
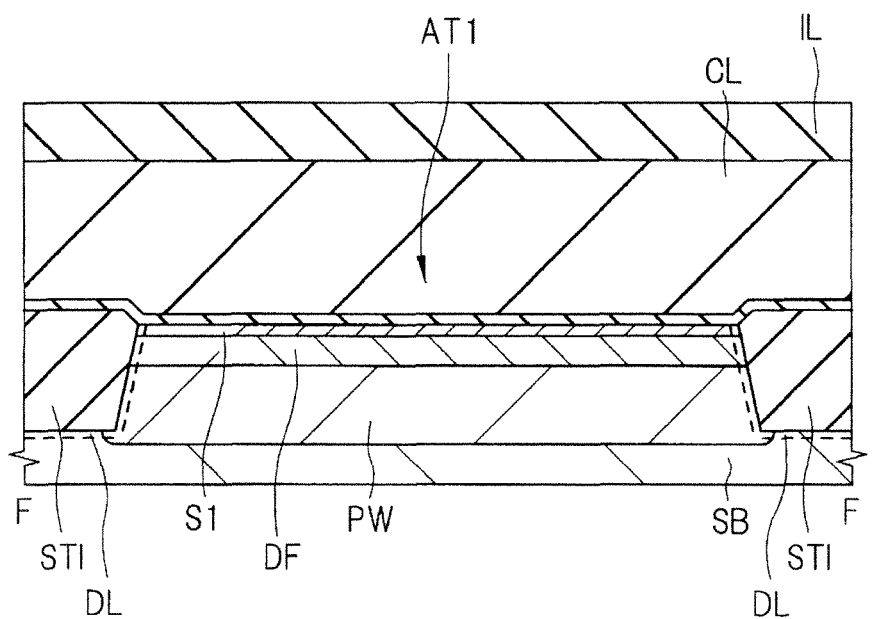
FIG. 16 is a sectional view, taken along F-F Line in FIG. 15.
Figure 17:
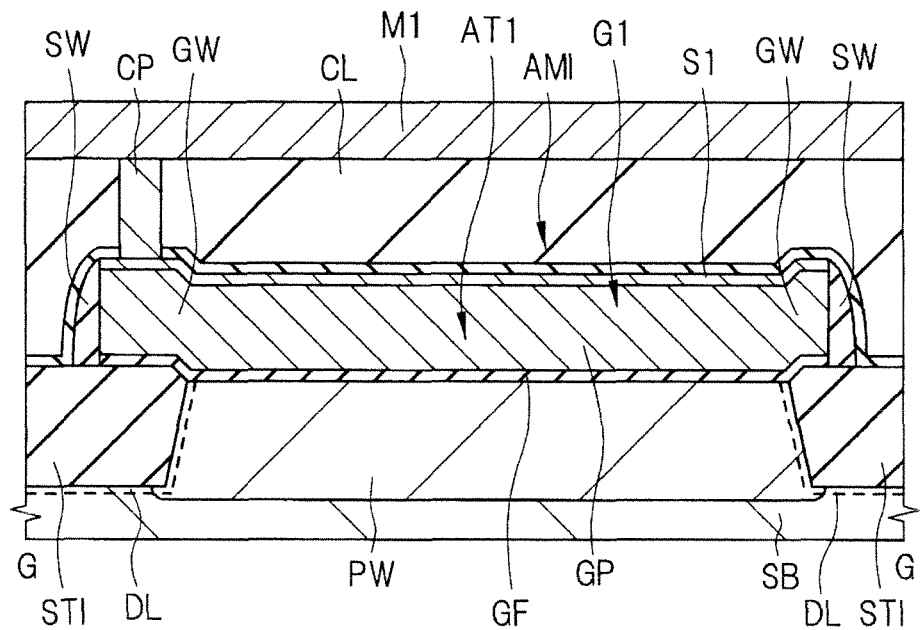
FIG. 17 is a sectional view, taken along G-G Line in FIG. 15.

In the present embodiment, a configuration will be described with reference to FIGS. 15 to 17, in which, in an amplification transistor, conductive type impurities, which are the same as those in the channel region of the amplification transistor, are introduced into an active region near the boundary between an element isolation region and the active region, in order to prevent a dark current from flowing in the active region near the boundary between them. FIG. 15 is a planar layout illustrating a semiconductor device of the present embodiment in a portion corresponding to that in FIG. 3. FIG. 16 is a sectional view, taken along F-F Line in FIG. 15. FIG. 17 is a sectional view, taken along G-G Line in FIG. 15.

The selection transistor SEL and the amplification transistor AMI illustrated in FIG. 15 have the same structures as those of the selection transistor SEL and the amplification transistor AMI illustrated in FIG. 7, respectively. In the semiconductor device of the present embodiment illustrated in FIG. 15, however, a diffusion layer DL is formed in an active region AT1 near the boundary between the active region AT1 and an element isolation region STI by introducing a relatively high concentration of p-type impurities (e.g., B (boron)).

In FIG. 15, the boundary between the element isolation region STI covered by each of the gate electrodes G1 and G2, and the outline of the diffusion layer DL covered by each of them are illustrated by dashed lines.

The diffusion layer DL is a semiconductor layer formed in a semiconductor substrate SB, the diffusion layer DL being formed by using steps of forming a semiconductor device and formed specifically in the following way: the semiconductor substrate is first prepared and an isolation trench for embedding the element isolation region STI is then formed; and thereafter ion implantation is performed via, for example, the mask used in an etching step of forming the isolation trench. In the ion implantation step, p-type impurities (e.g., B (boron)), which are conductive type impurities located in the channel region of the amplification transistor AMI, are implanted into the surface of the semiconductor substrate SB.

Accordingly, the diffusion layer DL is annularly formed, in plan view, along each side of the active region AT1, the each side forming the outline of the active region AT1. Because the diffusion layer DL is formed in a state where the aforementioned isolation trench is opened by ion implantation, the diffusion layer DL is also formed in the semiconductor substrate SB adjacent to the bottom surface of the element isolation region STI, not only in the semiconductor substrate SB adjacent to the sidewall of the element isolation region STI, as illustrated in FIGS. 16 and 17. In FIGS. 16 and 17, the outline of the diffusion layer DL in the semiconductor substrate SB is illustrated by dashed lines.

As described above, the diffusion layer DL is a semiconductor layer that has a conductive type different from that of a transistor formed by a gate electrode immediately above the diffusion layer. That is, the diffusion layer DL immediately below the gate electrode G1 of an amplification transistor AMI that is an n-channel type MOSFET is a p-type semiconductor layer, which is opposite to an n-type semiconductor layer. Similarly, the diffusion layer DL immediately below the gate electrode G2 of the selection transistor SEL that is an n-channel type MOSFET is a p-type semiconductor layer, which is opposite to an n-type semiconductor layer.

FIG. 16 illustrates the section of the source region of the amplification transistor AMI (see FIG. 15) in a region where the gate electrode G1 (see FIG. 15) is not formed. The p-type diffusion layer DL is formed in a region that is located in the top surface on the main surface side of the semiconductor substrate SB and is adjacent to the element isolation region STI. The n-type diffusion layer DF is formed over the upper surface of the active region AT1 exposed from the element isolation region STI. Herein, a large width part that forms the gate electrode G1 is not formed, and hence the diffusion layer DF is formed, in the gate width direction of the gate electrode G1, from one end portion of the active region AT1 to the other end portion thereof. A contact plug is not coupled to the source region of the amplification transistor AMI that is formed by the diffusion layer DF.

FIG. 17 illustrates a structure similar to the structure described with reference to FIG. 5. However, the p-type diffusion layer DL is formed in a region that is located in the top surface on the main surface side of the semiconductor substrate SB and is adjacent to the element isolation region STI. That is, the diffusion layer DL is formed in the active region AT1 that is located immediately below the large width part GW that forms the gate electrode G1 and located near the boundary between the active region AT1 and the element isolation region STI.

Because a threshold voltage becomes large in a region where the diffusion layer DL illustrated in FIGS. 15 to 17 is formed, it becomes difficult for a current to flow in the region, which can prevent a dark current from flowing in the amplification transistor AMI. That is, occurrence of a dark current can be prevented with the diffusion layer DL being formed in the active region AT1 near the boundary between the active region AT1 and the element isolation region STI. However, when the diffusion layer DL is formed, there is the problem that 1/f noise is increased in a transistor.

Accordingly, by providing the large width part GW, having a gate length larger than that of the gate electrode part GP, in an end portion in the gate width direction of the gate electrode G1 and by forming the diffusion layer DL, occurrence of a dark current can be prevented and the effect of reducing 1/f noise can be obtained.

It is desirable that the diffusion layer DL is not formed in an active region (e.g., the active region AT2 and the photodiodes PD1 and PD2 illustrated in FIG. 1) other than the active region AT1 where the selection transistor SEL and the amplification transistor AMI are formed. This is because, if the diffusion layer DL is formed in an active region below a forwarding transistor or a resetting transistor, in which occurrence of a dark current does not become a problem in comparison with the amplification transistor AMI, there is the fear that the performance of an element, such as the forwarding transistor or the resetting transistor, may be deteriorated. Further, because the large width part GW is not formed in the gate electrode of a transistor other than the amplification transistor, there is the fear that 1/f noise may be increased in the transistor if the diffusion layer DL is formed in each transistor.

Accordingly, the performance of a semiconductor device can be improved by limiting an area in which the diffusion layer DL is to be formed to the inside of the active region AT1 where the selection transistor SEL and the amplification transistor AMI are formed.

By forming the diffusion layer DL in an active region that is located immediately below the gate electrode G1 that forms the amplification transistor AMI and located near the boundary between the active region AT1 and the element isolation region STI, as described above, occurrence of a dark current can be suppressed. Accordingly, a region where the diffusion layer DL is to be formed may be limited to only a region immediately below the gate electrode G1, from the viewpoint of suppressing occurrence of a dark current. So, a structure is illustrated in FIG. 18 as a planar layout of a variation of the semiconductor device of the present embodiment, in which the diffusion layer DL is formed only immediately below the gate electrode G1 and is not formed in the active region AT1 exposed from the gate electrode G1.

Figure 18:
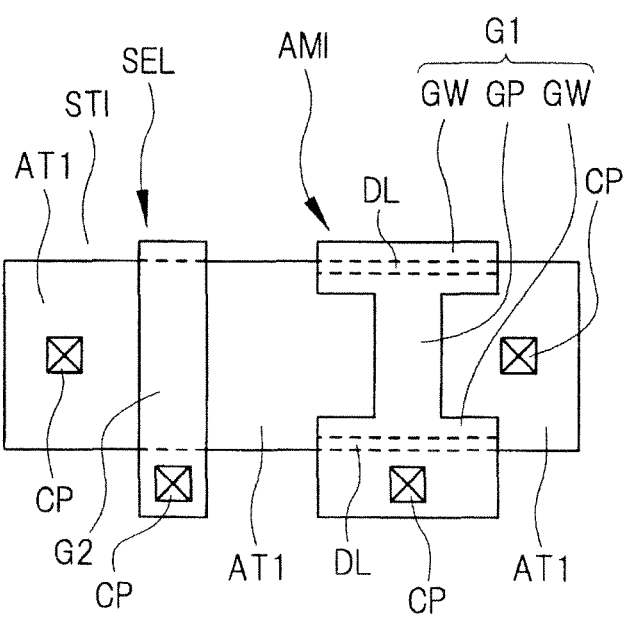
FIG. 18 is a planar layout illustrating a semiconductor device according to a variation of Third Embodiment of the invention.

The only difference between the structures illustrated in FIGS. 18 and 15 is a layout of the diffusion layer DL. As illustrated in FIG. 18, the diffusion layer DL is only formed along the direction in which the large width part GW extends and only formed in the active region AT1 that is located immediately below the large width part GW and located near the boundary between the active region AT1 and the element isolation region STI. Even with such a structure, the effect of reducing 1/f noise in the amplification transistor AMI can be obtained, similarly to the semiconductor device described with reference to FIGS. 15 to 17.

The diffusion layer DL is formed by using steps of forming the structure illustrated in FIG. 18 and formed specifically in the following way: an isolation trench for forming the element isolation region STI is first opened in the upper surface of a semiconductor substrate; a mask used in an etching step of forming the isolation trench is then removed; and after a resist pattern for opening a region where a large width part is to be formed is formed, ion implantation is performed by using the resist pattern as a mask.

In the semiconductor device of the variation, a decrease in the performance of the selection transistor SEL can be prevented by not forming the diffusion layer DL in the active region AT1 under the selection transistor SEL in which occurrence of a dark current hardly becomes a problem in comparison with the amplification transistor AMI.

The invention made by the present inventors has been specifically described above based on preferred embodiments, but the invention should not be limited to the preferred embodiments, and it is needless to say that various modifications may be made to the invention within a range not departing from the gist of the invention.

The resetting transistor may be formed, for example, over the same active region as the selection transistor and the amplification transistor.

It has been described in FIG. 10 that two gate electrode parts GP are formed; however, three or more gate electrode parts GP may be formed, not limiting to two. As the number of fingers is larger, the number of the regions, in each of which the boundary between an active region and an element isolation region overlaps a gate electrode, is further increased, and hence the effect in Second Embodiment can be more greatly obtained. Additionally, as the number of fingers is larger, the gate width of each finger, namely, the gate width of each gate electrode part can be made smaller, and hence the occupancy of a photodiode can be further enhanced, which can improve the performance of an image pickup device.

What is claimed is:

1. A semiconductor device comprising:
   a photoelectric conversion element that generates a signal electric charge in accordance with a light amount of incident light;
   a forwarding transistor that forwards the signal electric charge to a charge detector;
   an amplification transistor that outputs an electric signal corresponding to a potential variation in the charge detector;
   a resetting transistor that resets a potential of the charge detector to a predetermined value; and
   a selection transistor that externally outputs the electric signal the amplification transistor outputs,
   wherein a first gate electrode of the amplification transistor and a second gate electrode of the selection transistor, which cross over an active region surrounded by an element isolation region, are formed in the active region, and
   wherein in a portion immediately above the active region, a gate length of at least one end portion in a gate width direction of the first gate electrode is larger than that of a central portion in the gate width direction of the first gate electrode.

2. The semiconductor device according to claim 1,
   wherein the first gate electrode has a structure in which a plurality of third electrodes arrayed in the gate width direction are coupled in parallel with each other.

3. The semiconductor device according to claim 1,
   wherein in a portion immediately above the active region, a gate length of each of both end portions in the gate width direction of the first gate electrode is larger than that of a central portion in the gate width direction of the first gate electrode.

4. The semiconductor device according to claim 1,
   wherein in a portion immediately below the first gate electrode, a diffusion layer, having the same conductive type as that of a channel region of the amplification transistor, is formed in the active region adjacent to the element isolation region.

5. The semiconductor device according to claim 4,
   wherein in a portion immediately below the second gate electrode, a diffusion layer, having the same conductive type as that of a channel region of the selection transistor, is formed in the active region adjacent to the element isolation region.

6. The semiconductor device according to claim 5,
   wherein the resetting transistor, the forwarding transistor, and the photoelectric conversion element do not include the diffusion layer.

7. The semiconductor device according to claim 1,
   wherein the amplification transistor is arranged to be sandwiched by a plurality of photodiodes in the gate width direction of the first gate electrode.

* * * * *